(12) United States Patent
Shibata

(10) Patent No.: US 9,349,442 B2
(45) Date of Patent: May 24, 2016

(54) SEMICONDUCTOR MEMORY DEVICE

(71) Applicant: KABUSHIKI KAISHA TOSHIBA, Minato-ku (JP)

(72) Inventor: Noboru Shibata, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/688,442

(22) Filed: Apr. 16, 2015

(65) Prior Publication Data

US 2015/0302920 A1 Oct. 22, 2015

(30) Foreign Application Priority Data

Apr. 16, 2014 (JP) .................................. 2014-085018

(51) Int. Cl.

| | | |
|---|---|---|
| G11C 16/10 | (2006.01) | |
| G11C 11/56 | (2006.01) | |
| G11C 16/34 | (2006.01) | |
| G11C 16/04 | (2006.01) | |

(52) U.S. Cl.
CPC ........ *G11C 11/5635* (2013.01); *G11C 11/5628* (2013.01); *G11C 11/5642* (2013.01); *G11C 16/3459* (2013.01); G11C 16/0483 (2013.01); G11C 2211/5621 (2013.01)

(58) Field of Classification Search
CPC ............................ G11C 11/5628; G11C 16/10
USPC ........................................ 365/185.03, 185.24
See application file for complete search history.

(56) References Cited

U.S. PATENT DOCUMENTS

| | | | | |
|---|---|---|---|---|
| 8,612,716 | B2* | 12/2013 | Ishikawa | ............... G06F 12/084 711/129 |
| 9,019,770 | B2* | 4/2015 | Lin | ........................ G11C 16/26 365/185.12 |
| 2001/0002479 | A1* | 5/2001 | Asoh | ..................... G06Q 20/341 711/115 |
| 2005/0169057 | A1 | 8/2005 | Shibata et al. | |
| 2006/0036825 | A1* | 2/2006 | Maki | ..................... G06F 9/5016 711/165 |
| 2009/0091991 | A1 | 4/2009 | Cho et al. | |
| 2009/0097337 | A1* | 4/2009 | Fujita | ................. G11C 11/4076 365/189.15 |
| 2010/0073989 | A1* | 3/2010 | Kang | ..................... G11C 11/22 365/145 |
| 2010/0142270 | A1 | 6/2010 | Shibata | |
| 2011/0292736 | A1 | 12/2011 | Honda | |

FOREIGN PATENT DOCUMENTS

| | | |
|---|---|---|
| JP | 2005-243205 | 9/2005 |
| JP | 2010-160873 | 7/2010 |
| JP | 2010-541122 | 12/2010 |
| JP | 2011-253579 | 12/2011 |

* cited by examiner

*Primary Examiner* — Michael Tran
(74) *Attorney, Agent, or Firm* — Oblon, McClelland, Maier & Neustadt, L.L.P.

(57) ABSTRACT

According to one embodiment, a semiconductor memory device includes a memory cell array, a data storage circuit and a control circuit. The data storage circuit holds first data to be written into the memory cell and holds 1 bit data calculated from the first data. The control circuit writes the data of n bits into the memory cell in a first write operation and then executes a second write operation. The control circuit carries out the following control in the second write operation. It reads data stored in the memory cell in the first write operation. It restores the first data based on the data read from the memory cell and the 1 bit data held in the data storage circuit. It writes the restored first data into the memory cell.

20 Claims, 28 Drawing Sheets

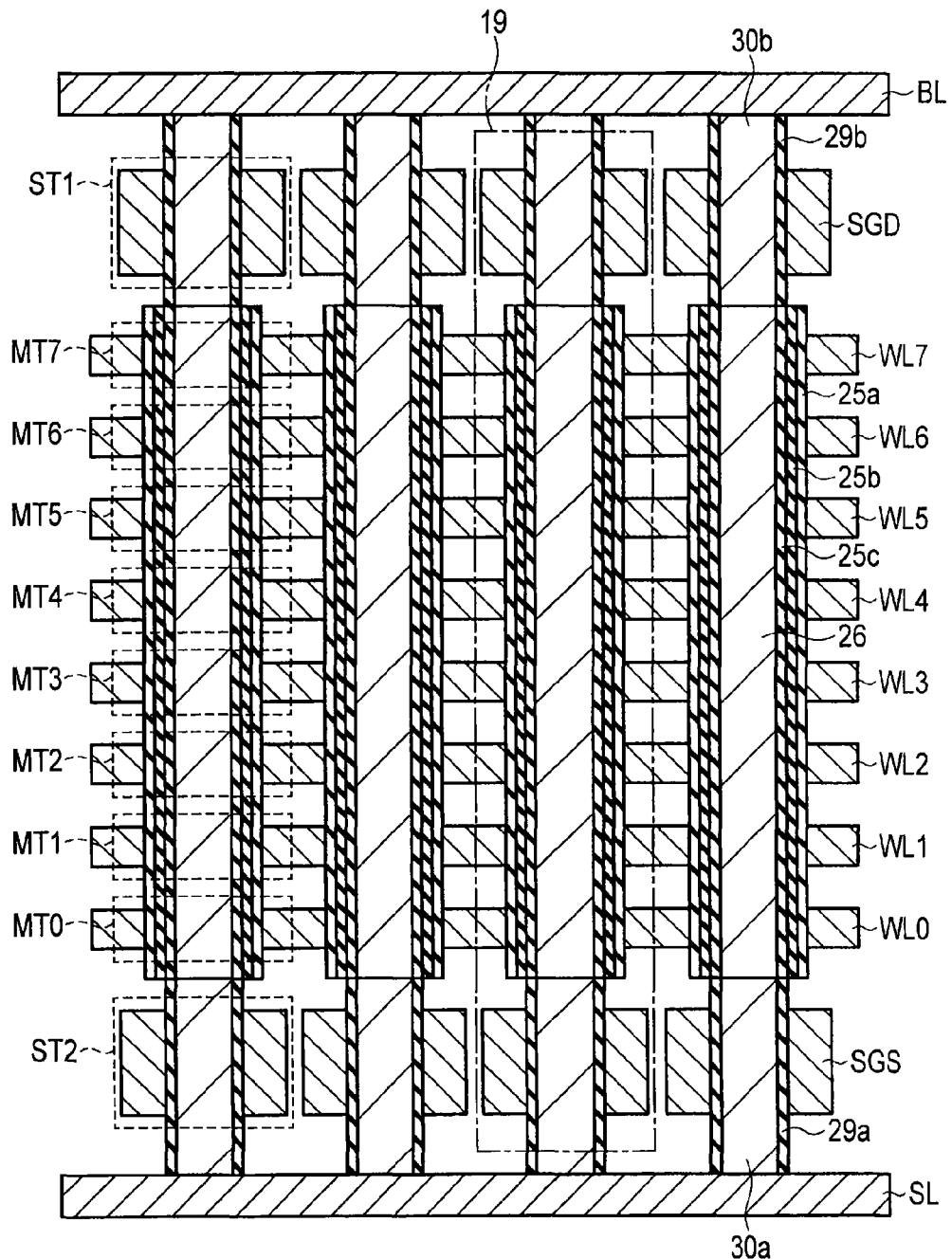
F I G. 8

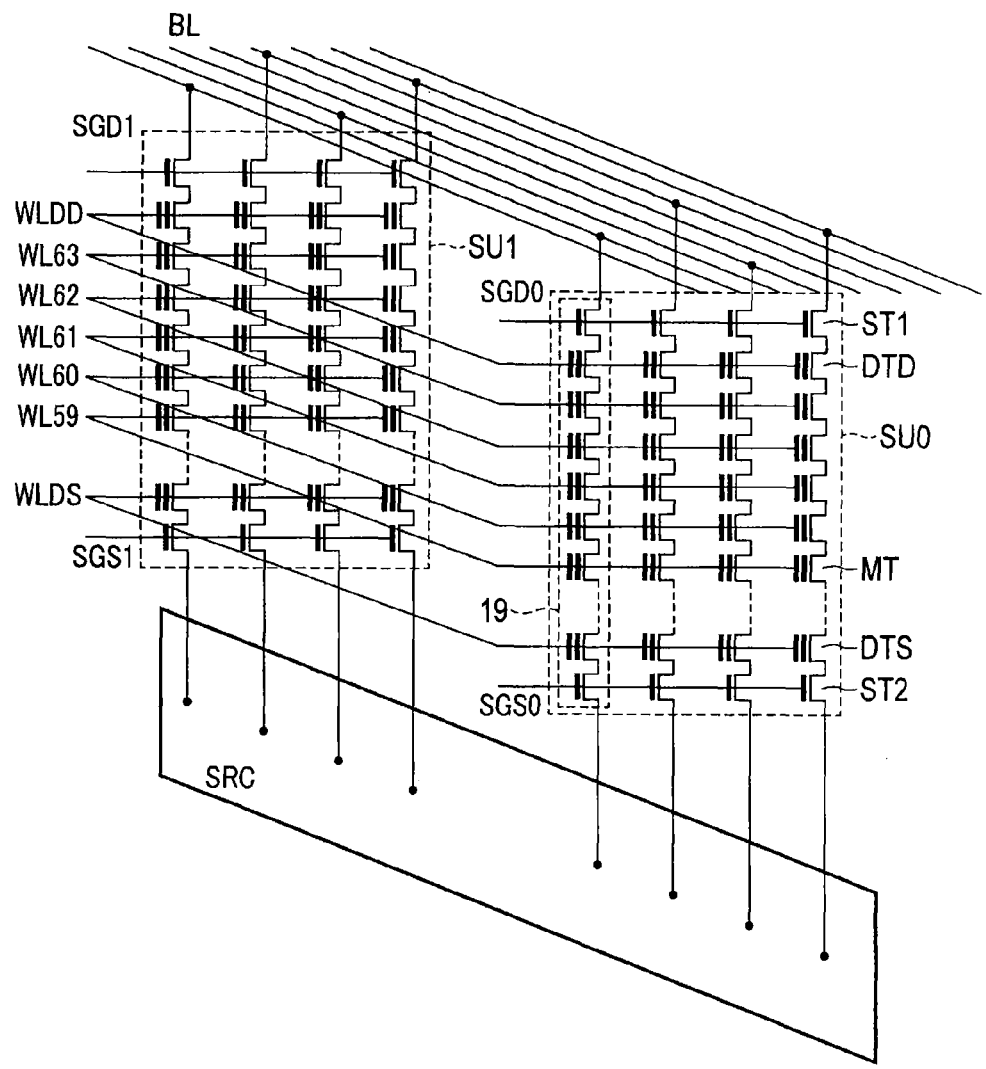
F I G. 9

| | Cell(P-well) | Cell(N-well) | HVTr(P-sub) | LVNch(P-well) | LVPch(N-well) | HVPch(N-well) |
|---|---|---|---|---|---|---|
| Erase | Vera(20V) | Vera(20V) | Vss(0V) | Vss(0V) | Vdd(2.5V) | Vdd(2.5V) |
| Program | Vss(0V) | Vss(0V) | Vss(0V) | Vss(0V) | Vdd(2.5V) | Vdd(2.5V)/Vpgmh |
| Read | Vss(0V) | Vss(0V) | Vss(0V) | Vss(0V) | Vdd(2.5V) | Vdd(2.5V)/Vreadh |

F I G. 10

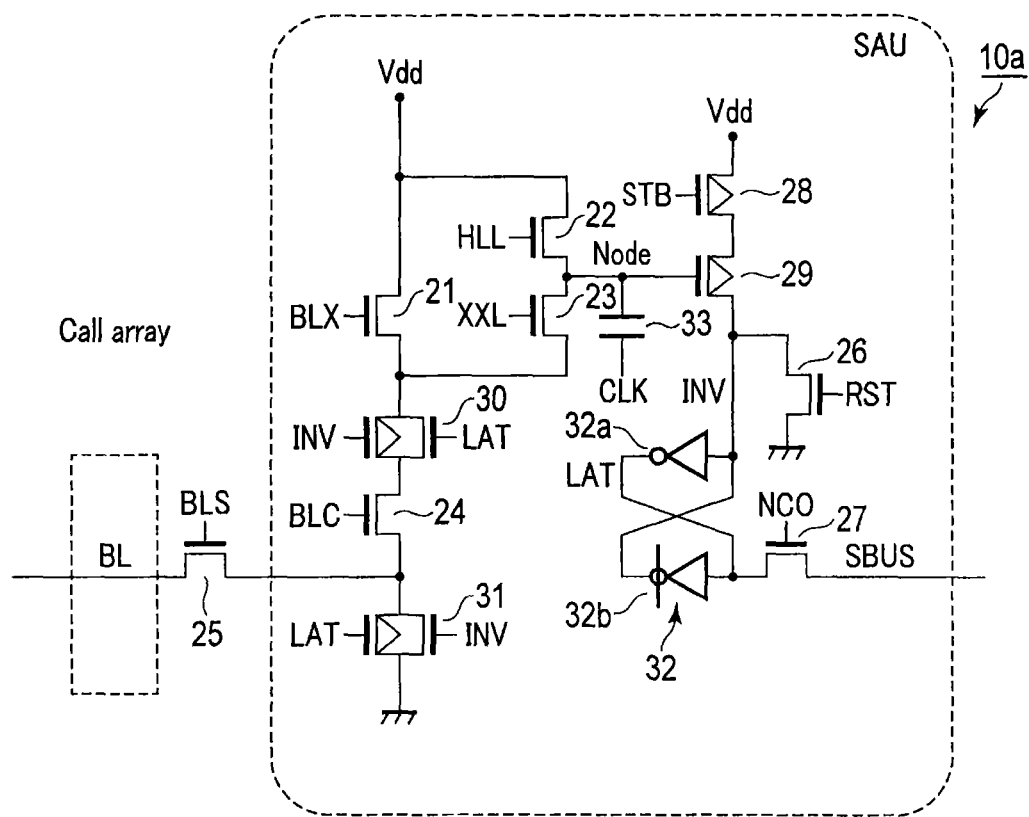
F I G. 11

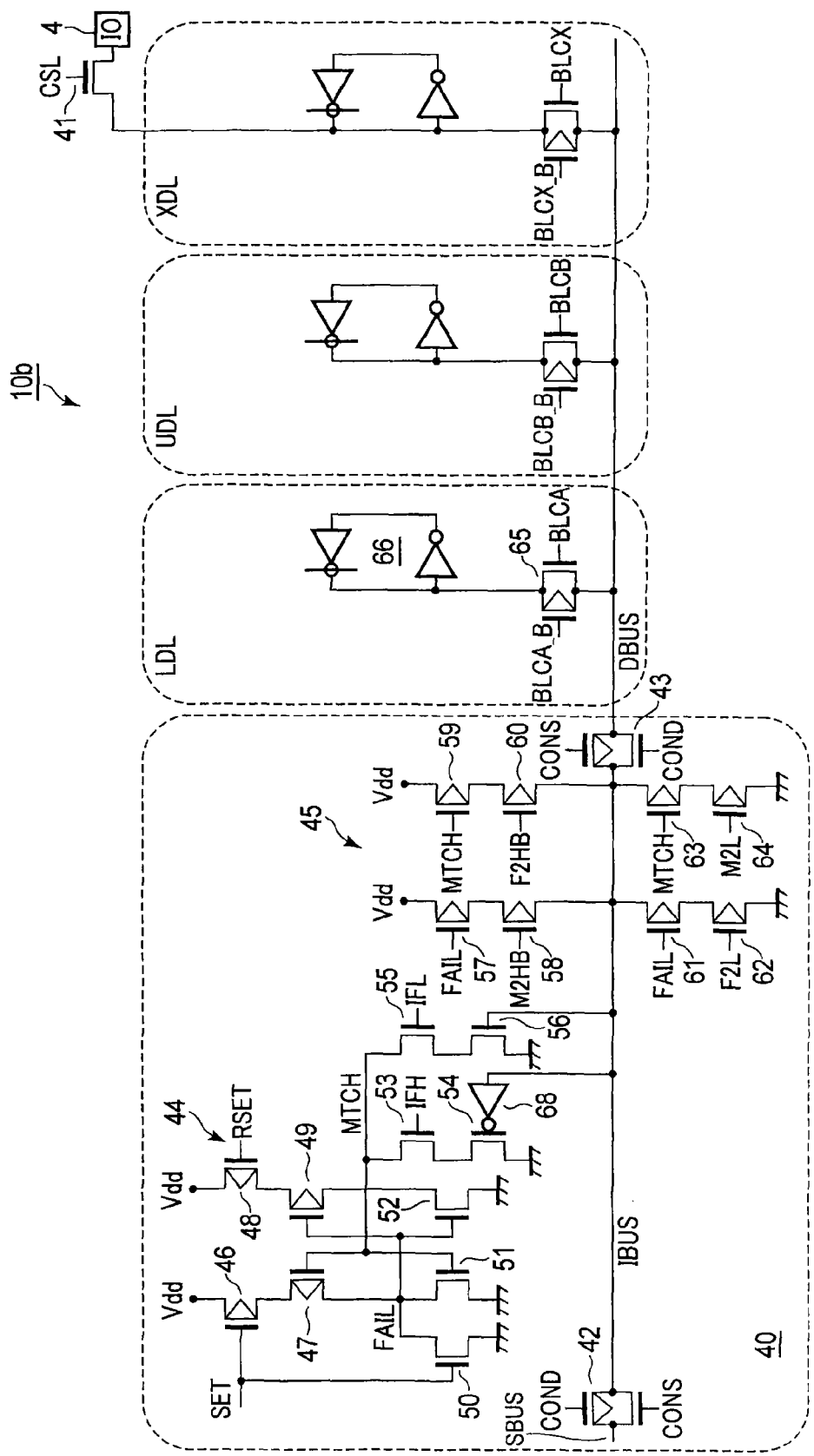
F I G. 12

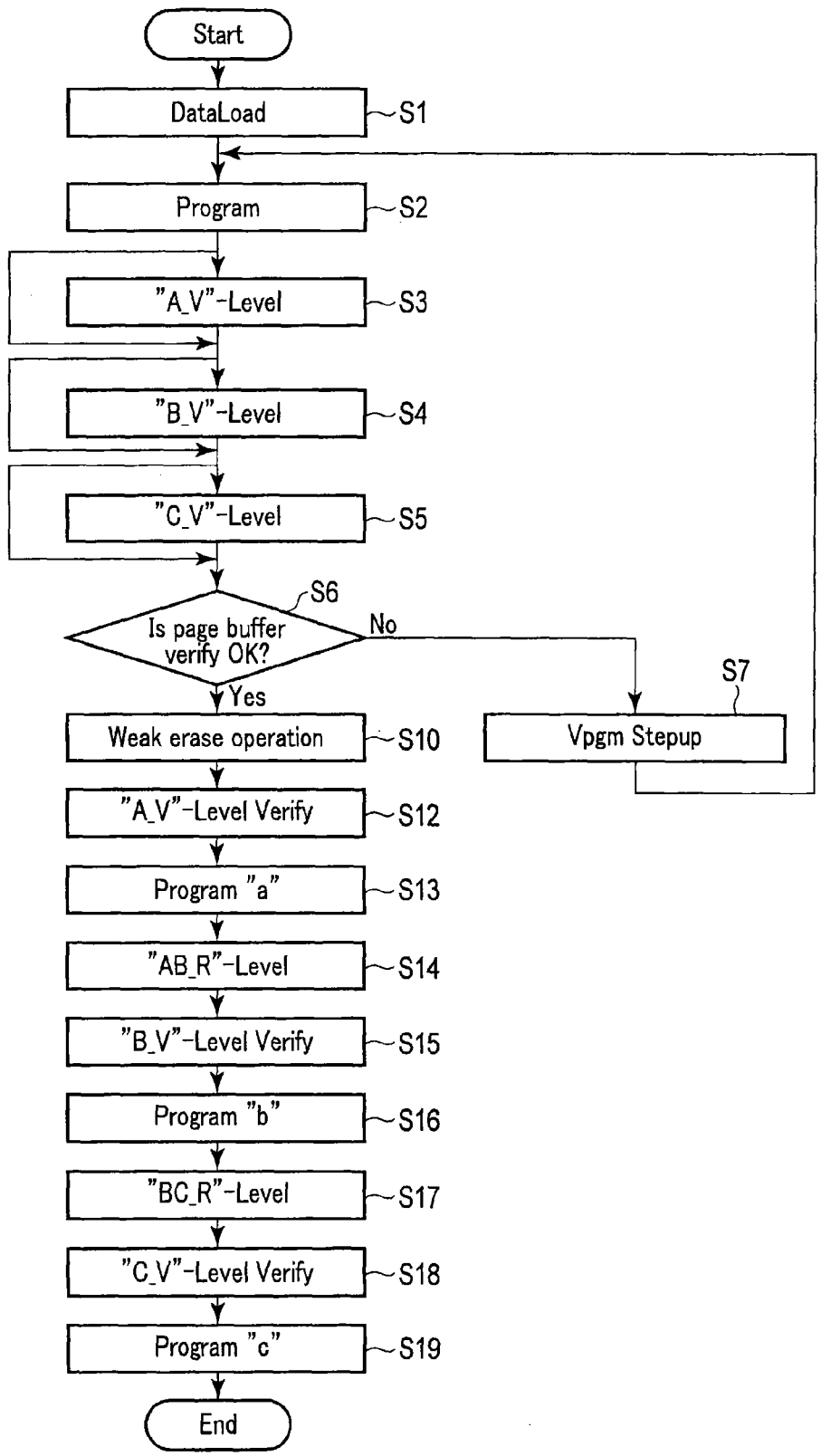
F I G. 22

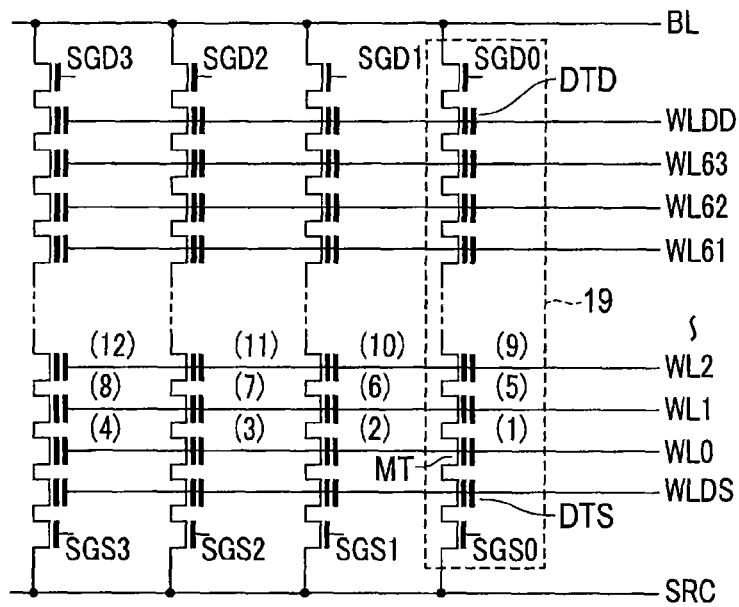
F I G. 27
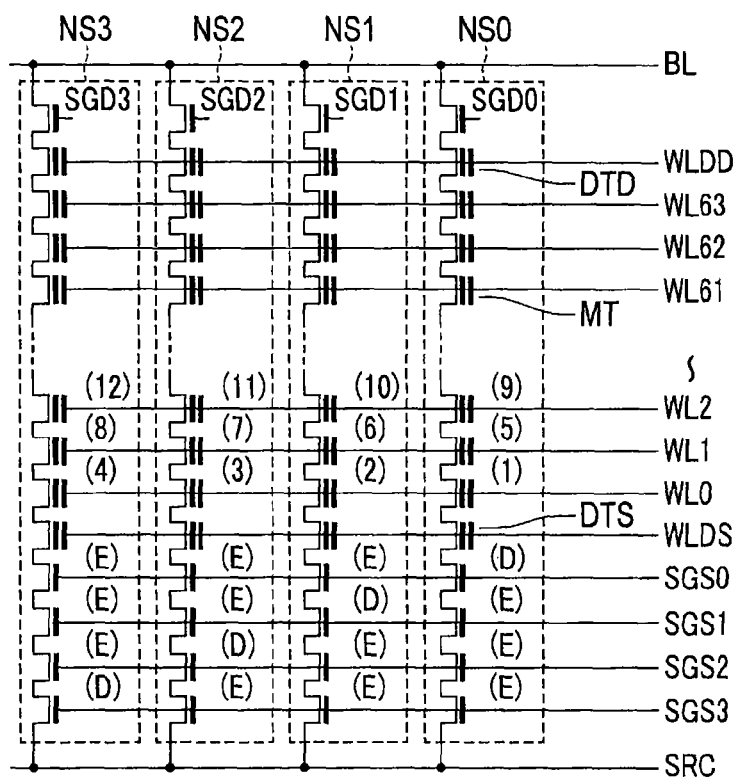
F I G. 28

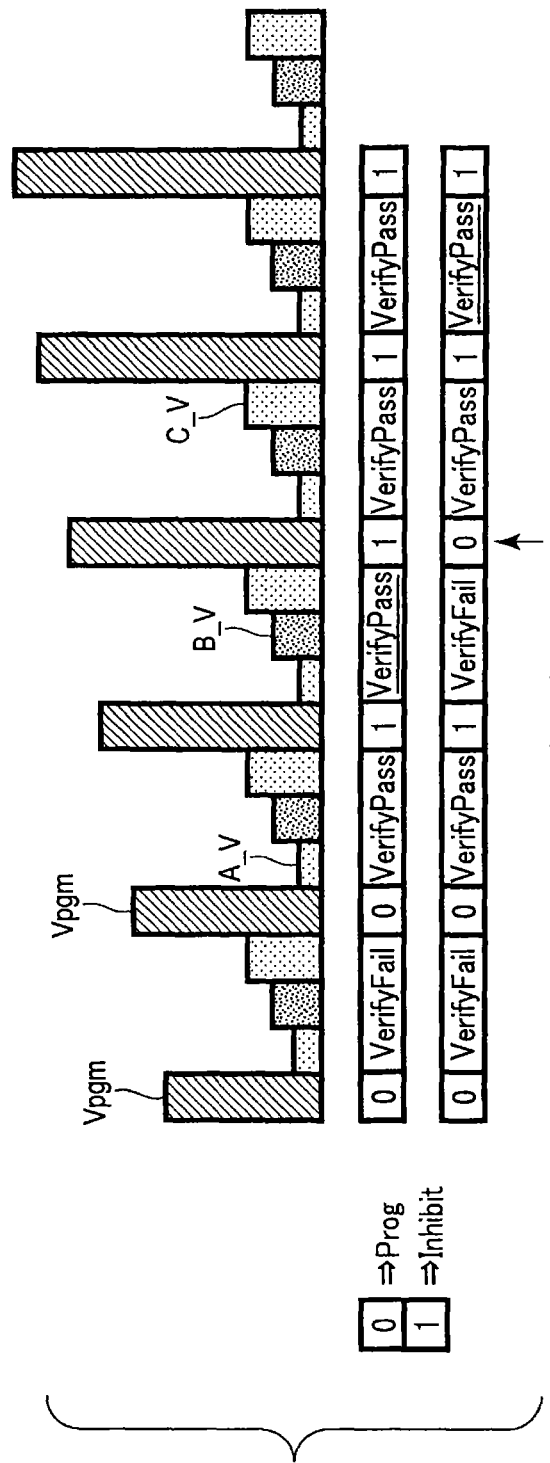
F I G. 30

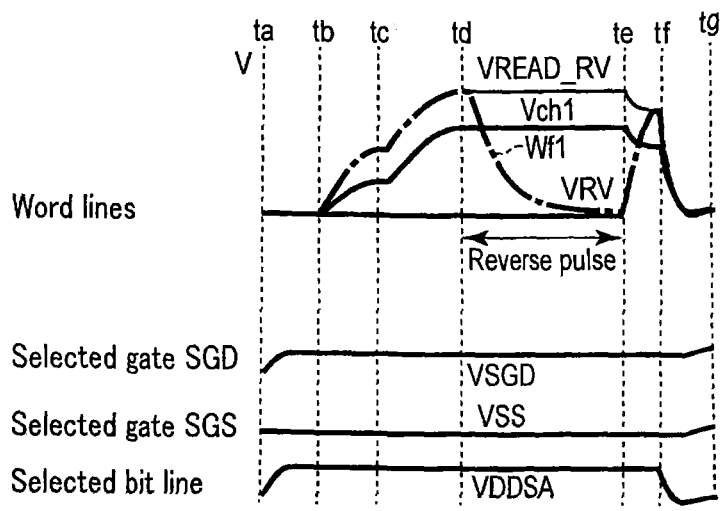
F I G. 31
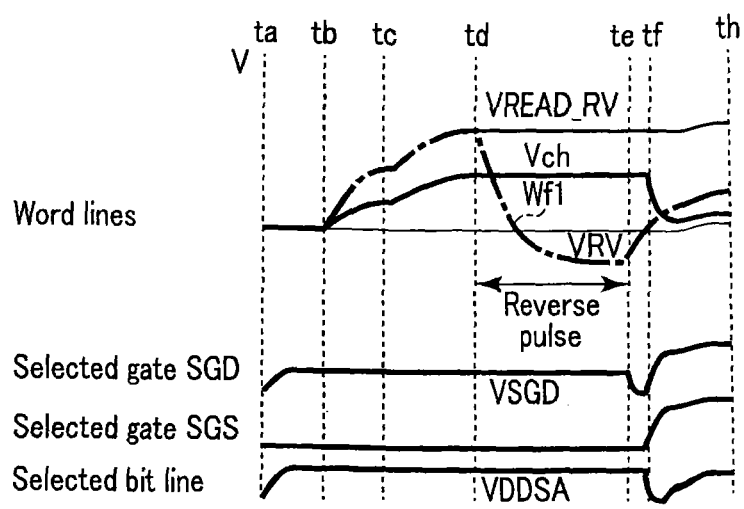
F I G. 32

SEMICONDUCTOR MEMORY DEVICE

CROSS-REFERENCE TO RELATED APPLICATIONS

This application is based upon and claims the benefit of priority from Japanese Patent Application No. 2014-085018, filed Apr. 16, 2014, the entire contents of which are incorporated herein by reference.

FIELD

Embodiments described herein relate generally to a semiconductor memory device that can store multilevel data.

BACKGROUND

In a semiconductor memory device, e.g., an NAND flash memory, all or half of memory cells aligned in a row direction are connected through bit lines to latch circuits for writing and reading respectively, and a write or read operation is collectively performed with respect to all or half of the memory cells (e.g., memory cells of 2 to 16 kB) aligned in the row direction.

A write or read unit is called a page, and a block includes pages. Erasing with respect to memory cells is performed in unites of blocks. Electrons are extracted from the memory cells by an erase operation to negatively set a threshold voltage, and the electrons are introduced into the memory cells by a write operation, whereby the threshold voltage is positively set.

A multilevel memory has been recently developed, which sets one of threshold voltages (which are also referred to as threshold levels hereinafter) to one memory cell and stores data of bits. For example, when 4 threshold levels are provided, data of 2 bits can be stored in one cell; and when 8 threshold levels are provided, data of 3 bits can be stored in one cell. Further, when 16 threshold levels are provided, data of 4 bits can be stored in one cell.

On the other hand, miniaturization for processing a floating gate of an element has recently become rigorous, a structure that stores electrons in MONOS cells has been also suggested, and density growth realized by three-dimensional arrangement has been devised in particular. However, a threshold value Vth of the MONOS cells decreases due to detrapping immediately after a write operation in some cases.

As a countermeasure, there is a method of again performing a verify operation after a first write sequence and again carrying out writing with respect to cells, which have not reached a target threshold value, in accordance with each threshold value. However, this method can solve the detrapping problem but increases a write time. That is, at the time of performing rewriting with respect to memory cells that have not reached a target threshold value, one write pulse could be supplied to each threshold level, but a write threshold value used for writing must be held in a data storage circuit in a sense amplifier until this write pulse is supplied, and a cache program for storing subsequent write data in the data storage circuit in advance cannot be executed in some cases.

BRIEF DESCRIPTION OF THE DRAWING

FIG. 8 is a cross-sectional view of another example of the memory cell array of the NAND flash memory having the three-dimensional structure;

FIG. 9 is a circuit diagram of another example of the memory cell array of the NAND flash memory having the three-dimensional structure;

FIG. 10 is a view showing an example of voltages supplied to respective regions depicted in FIG. 5;

FIG. 11 is a circuit diagram of a sense amplifier unit in a data storage circuit in the first embodiment;

FIG. 12 is a circuit diagram of a data control unit in the data storage circuit in the first embodiment;

FIG. 22 is a flowchart showing a program sequence according to a modification of the first embodiment;

FIG. 27 is a circuit diagram of a memory cell array of the NAND flash memory having a three-dimensional structure;

FIG. 28 is a circuit diagram showing another example of the memory cell array of the NAND flash memory having the three-dimensional structure;

FIG. 30 is a view showing a write operation and a write verify operation in a program sequence according to a fourth embodiment;

FIG. 31 is an operation waveform chart showing a weak erase operation in the embodiment; and FIG. 32 is an operation waveform chart showing another weak erase operation in the embodiment.

DETAILED DESCRIPTION

Figure 1:
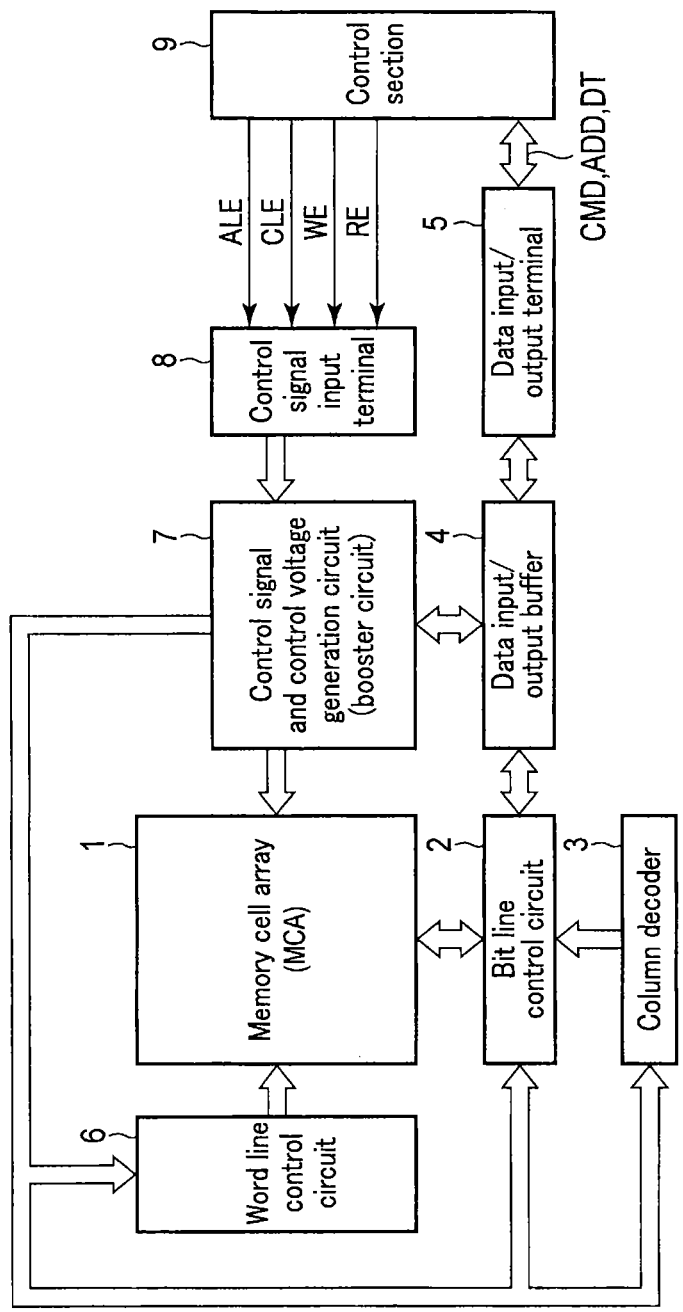
FIG. 1 is a block diagram showing a configuration of an NAND flash memory as a semiconductor memory device according to a first embodiment.

In general, according to one embodiment, a semiconductor memory device includes a memory cell array, a data storage circuit and a control circuit. The memory cell array includes memory cells each of which can store data of n bits (n is a natural number equal to 2 or more). The data storage circuit holds first data to be written into one of the memory cells and also holds 1 bit data calculated from the first data. The control circuit writes the data of n bits into the memory cell in a first write operation and then executes a second write operation. The control circuit carries out the following control in the second write operation. It reads data stored in the memory cell in the first write operation. It restores the first data based on the data read from the memory cell and the 1 bit data held in the data storage circuit. It writes the restored first data into the memory cell.

An embodiment will now be described hereinafter with reference to the drawings. It is to be noted that like reference numerals denote constituent elements having like functions and structures.

First Embodiment

A semiconductor memory device according to a first embodiment will now be described.

FIG. 1 shows a configuration of an NAND flash memory as a semiconductor memory device that stores 2 values (1 bit), 4 values (2 bits), or 8 values or more (3 bits or more) in each of memory cells.

A memory cell array 1 includes bits lines, word lines, and a common source line, and has memory cells, which are formed of, e.g., EEPROM cells and in which data is electrically rewritable, arranged in a matrix form. The memory cell array 1 is connected to a bit line control circuit 2 that controls the bit lines and a word line control circuit 6.

The bit line control circuit 2 reads data from the memory cells in the memory cell array 1 through the bit lines. The bit line control circuit 2 detects states of the memory cells in the memory cell array 1 through the bit lines or applies a write control voltage to the memory cells in the memory cell array 1 through the bit lines to write data in the memory cells.

The bit line control circuit 2 is connected to a column decoder 3 and a data input/output buffer 4. Data storage circuits in the bit line control circuit 2 are selected by the column decoder 3. Data of the memory cells read to the data storage circuits is output to a control section 9 from a data input/output terminal 5 through the data input/output buffer 4. The data input/output terminal 5 is connected to the control section 9 outside a memory chip.

The control section 9 includes, e.g., a microcomputer and receives data output from the data input/output terminal 5. Further, the control section 9 outputs various kinds of commands CMD that control operations of the NAND flash memory, an address ADD, and data DT. Write data input from the control section 9 to the data input/output terminal 5 is supplied to a data storage circuit selected by the column decoder 3 through the data input/output buffer 4, and a command and an address are Supplied to a control signal and control voltage generation circuit (a control circuit) 7.

The word line control circuit 6 is connected to the memory cell array 1. This word line control circuit 6 selects a word line in the memory cell array 1, and applies a voltage required for reading, writing, or erasing to the selected word line. The memory cell array 1, the bit line control circuit 2, the column decoder 3, the data input/output buffer 4, and the word line control circuit 6 are connected to the control signal and control voltage generation circuit 7.

The control signal and control voltage generation circuit 7 controls operations of the memory cell array 1, the bit line control circuit 2, the column decoder 3, the data input/output buffer 4, and the word line control circuit 6. The control signal and control voltage generation circuit 7 is connected to a control signal input terminal 8, and controlled by control signals Address Latch Enable (ALE), Command Latch Enable (CLE), write Enable (WE), and Read Enable (RE) input from the control section 9 through the control signal input terminal 8. The control signal and control voltage generation circuit 7 generates voltages of the word lines or the bit lines at the time of writing data and also generates a voltage supplied to a well as will be described later. The control signal and control voltage generation circuit 7 includes a booster circuit like a charge pump circuit, and can generate a program voltage and other high voltages.

The bit line control circuit 2, the column decoder 3, the word line control circuit 6, and the control signal and control voltage generation circuit 7 constitute a write circuit and a read circuit.

Figure 2:
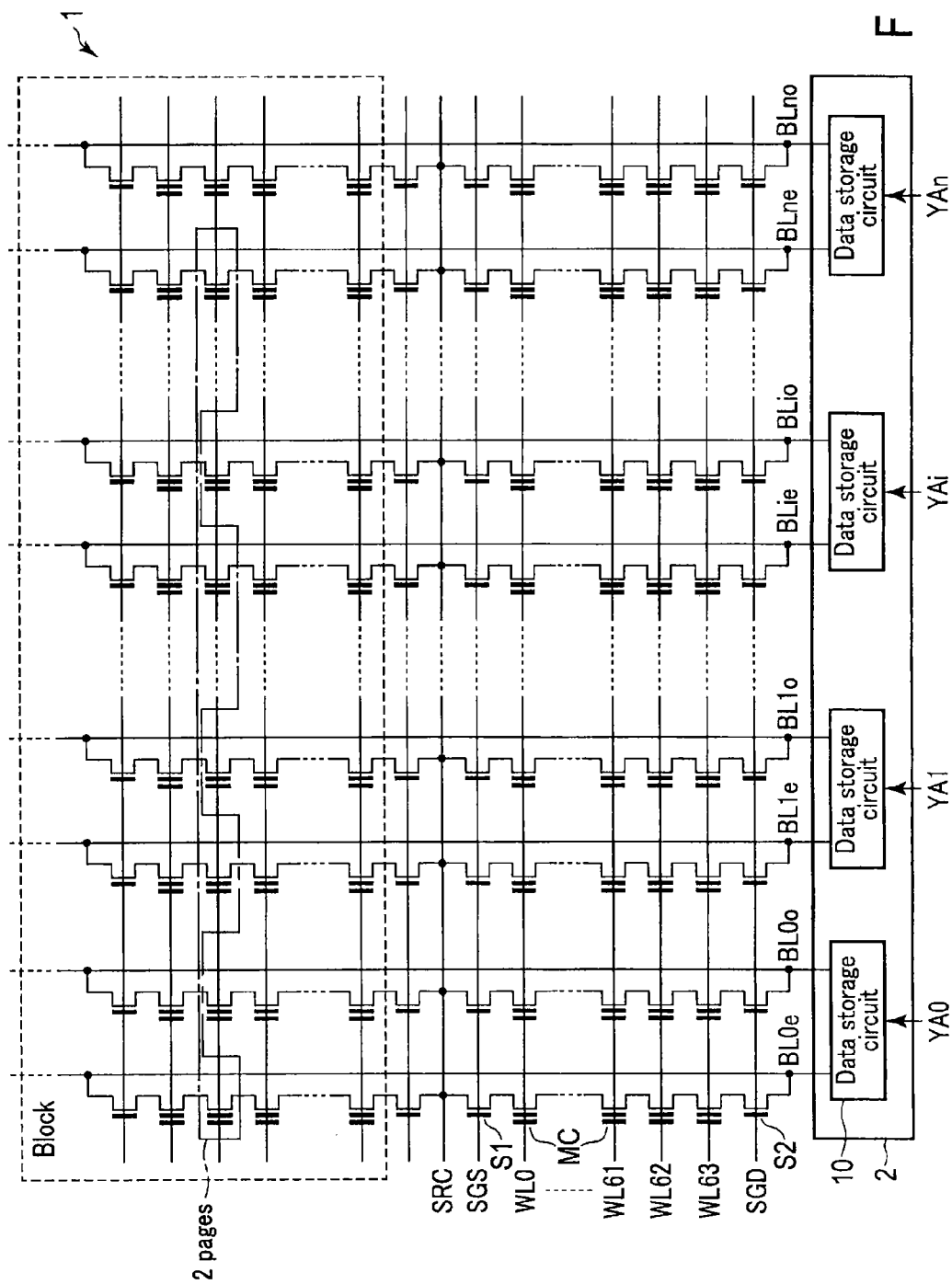
FIG. 2 is a circuit diagram of a memory cell array and a bit line control circuit in the first embodiment.

FIG. 2 shows an example of configurations of the memory cell array 1 and the bit line control circuit 2. NAND units are arranged in the memory cell array 1. One NAND unit includes memory cells MC formed of, e.g., 64 EEPROMs connected in series, and selection gates S1 and S2. The selection gate S2 is connected to a bit line BL0e, and the selection gate S2 is connected to a source line SRC. Control gates of the memory cells arranged in each row are connected to word lines WL0 to WL63 in common. Furthermore, the selection gate S2 is connected to a select line SGD in common, and the selection gate S1 is connected to a select line SGS in common.

The bit line control circuit 2 has data storage circuits 10. A pair of bit lines (BL0e, BL0o), (BL1e, BL1o) (BL1e, BL1o), or (BLne, BLno) is connected to each data storage circuit 10.

As indicated by a broken line, the memory cell array 1 includes blocks. Each blocks includes NAND units, and data is erased in, e.g., blocks. Moreover, an erase operation is simultaneously carried out with respect to two bit lines connected to the data storage circuit 10.

Additionally, memory cells arranged every other bit line and connected to one word line (memory cells in the range surrounded by the broken line) constitute one sector. Data is written or read in accordance with each sector. That is, half of the memory cells arranged in a row direction are connected to corresponding bit lines. Thus, a write or read operation is executed to each half of the memory cells arranged in the row direction.

In a read operation, a program verify operation, and a program operation, one of two bit lines (BL1e, BL1o) connected to the data storage circuit 10 is selected in accordance with an address signal (YA0, YA1 . . . YAi . . . , or YAn) supplied from the outside. Further, in accordance with an external address, one word line is selected, and two pages indicated by the broken line are selected. The two pages are switched using an address.

Two pages are selected in case of storing 2 bits in 1 cell, one page is selected in case of storing 1 bit in 1 cell, three pages are selected in case of storing 3 bits in 1 cell, and four pages are selected in case of storing 4 bits in 1 cell.

Figure 3:
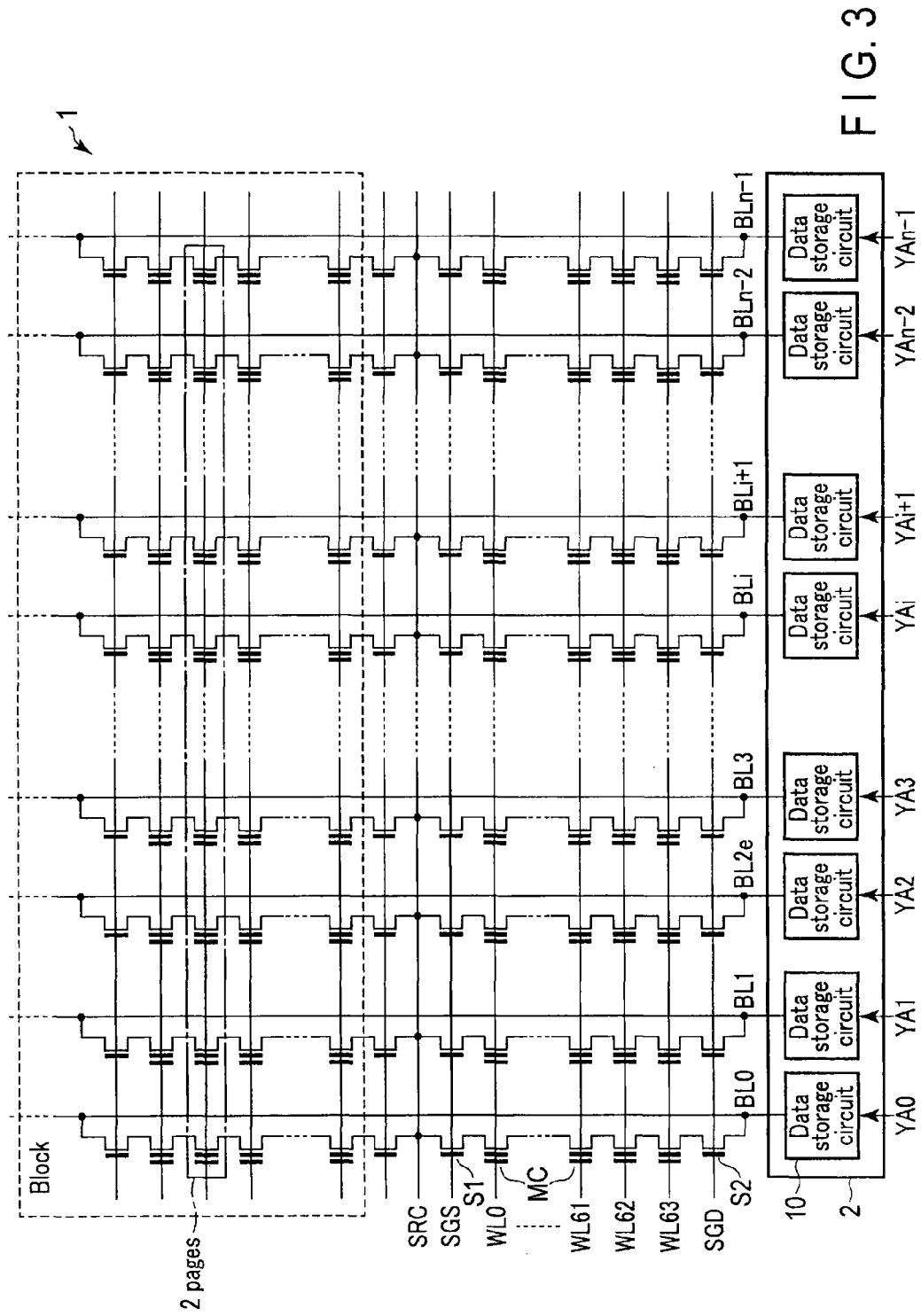
FIG. 3 is a circuit diagram of another example of the memory cell array and the bit line control circuit in the first embodiment.

FIG. 3 shows another example of the configuration of the memory cell array 1 and the bit line control circuit 2 depicted in FIG. 1. In case of the configuration shown in FIG. 2, two bit lines (BL1e, BL1o) are connected to the data storage circuit 10. On the other hand, in the configuration shown in FIG. 3, the data storage circuits 10 are connected to the bit lines respectively, and memory cells arranged in the row direction are all connected to corresponding bit lines. Thus, a write or read operation can be executed to all the memory cells arranged in the row direction.

It is to be noted that both the configuration shown in FIG. 2 and the configuration shown in FIG. 3 can be applied in the following description, but an example using FIG. 3 will be described below.

Figure 4A:
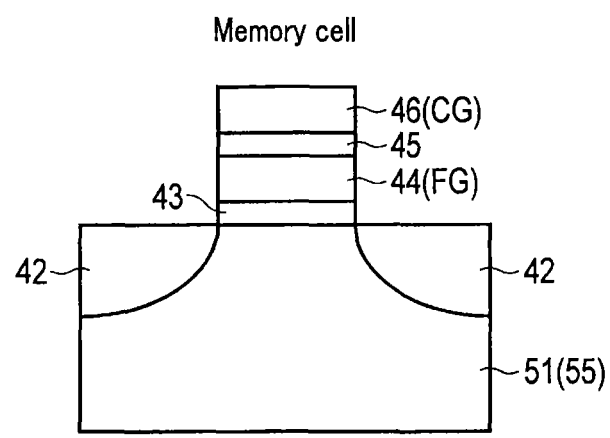
FIGS. 4A and 4B are cross-sectional views each showing a memory cell and a selection transistor in the first embodiment.
Figure 4B:
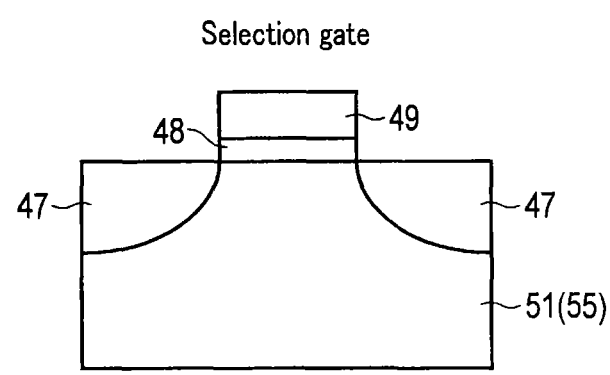

FIGS. 4A and 4B are cross-sectional views each showing a memory cell and a selection transistor. FIG. 4A shows a memory cell. In a substrate 51 (a later-described P-type well region 55), n-type diffusion layers 42 as a source and a drain of the memory cell are formed. A floating gate (FG) 44 is formed on the P-type well region 55 through a gate insulating film 43. A control gate (CG) 46 is formed on the floating gate 44 through an insulating film 45.

FIG. 4B shows a selection gate. In the P-type well region 55, n-type diffusion layers 47 as a source and a drain are formed. A control gate 49 is formed on the P-type well region 55 through a gate insulating film 48.

Figure 5:
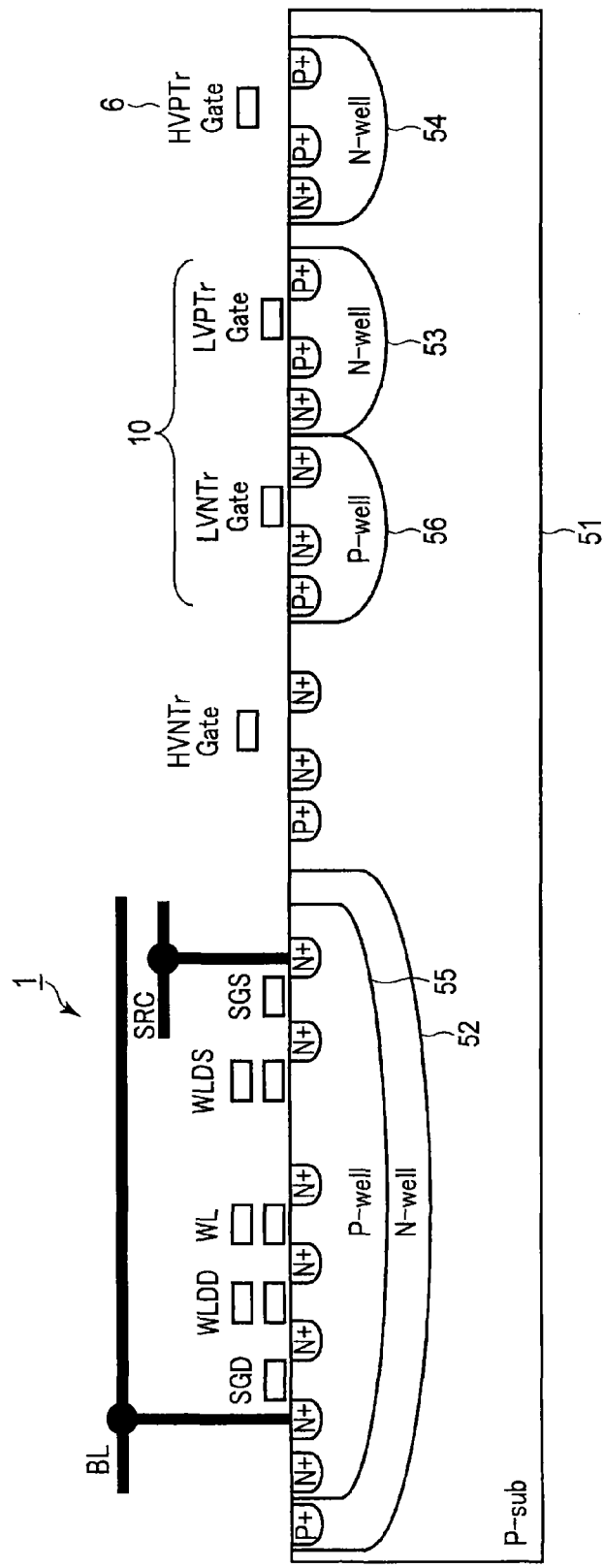
FIG. 5 is a cross-sectional view of an NAND flash memory in the first embodiment.

FIG. 5 shows a cross-sectional view of the NAND flash memory. For example, in the P-type semiconductor substrate 51, N-type well regions 52, 53, and 54 and a P-type well region 56 are formed. In the N-type well region 52, the P-type well region 55 is formed. A low-voltage N-channel transistor LVNTr constituting the memory cell array 1 is formed in the P-type well region 55. Furthermore, a low-voltage P-channel transistor LVPTr and the low-voltage N-channel transistor LVNTr constituting the data storage circuit 10 are formed in the N-type well region 53 and the P-type well region 56, respectively.

A high-voltage N-channel transistor HVNTr that connects the bit lines to the data storage circuits 10 is formed in the substrate 51. Moreover, a high-voltage P-channel transistor HVPTr constituting, e.g., a word line drive circuit is formed in the N-type well region 54. As shown in FIG. 5, the high-voltage transistors HVNTr and HVPTr have gate insulating films which are, for example, thicker than the low-voltage transistors LVNTr and LVPTr, respectively.

Figure 6:
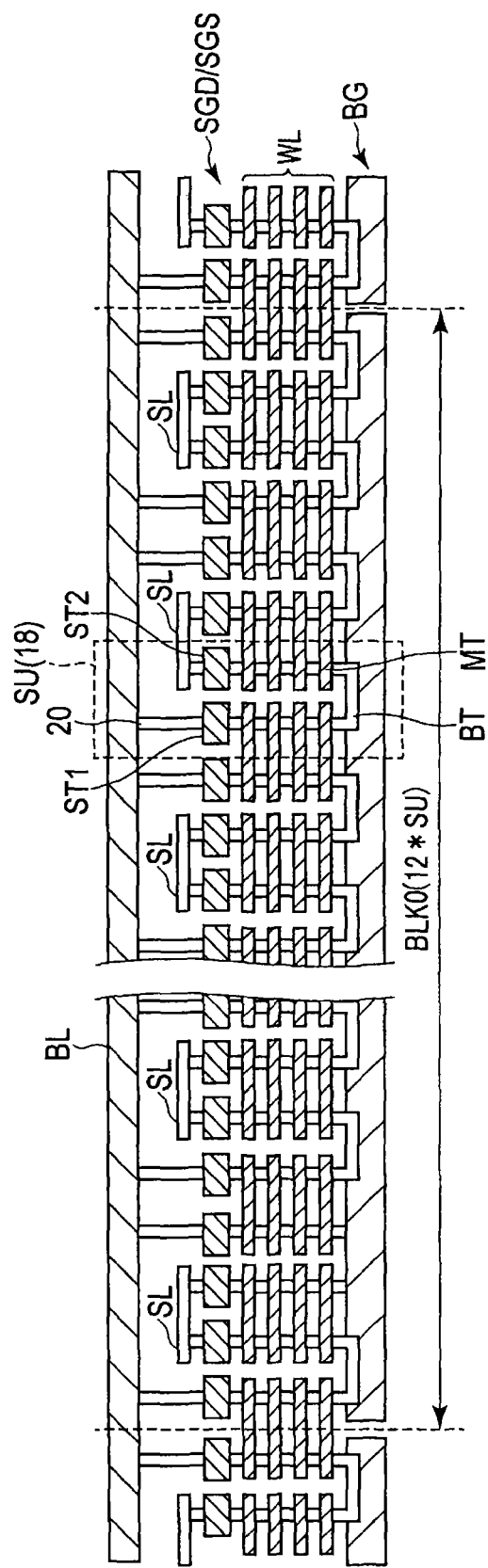
FIG. 6 is a cross-sectional view of a memory cell array of the NAND flash memory having a three-dimensional structure.

FIG. 6 shows a cross-sectional view of a block in a memory cell array of an NAND type flash memory having a three-dimensional structure called a Pipe type. FIG. 6 shows a configuration of one block BLK0 in the memory cell array, but other blocks BLK have the same configuration.

As shown in FIG. 6, the block BLK0 includes string units SU (12 in this example). Each string unit SU includes NAND strings 18.

Each NAND string 18 includes, e.g., 8 memory cell transistors MT, the selection transistors ST1 and ST2, and a back gate transistor BT. An interlayer insulating film is formed on a conductive layer (which will be referred to as a back gate layer hereinafter) BG, and semiconductor layers 20 are formed in the interlayer insulating film. The word lines WL connected to control gates of the memory cell transistors MT are formed around the semiconductor layers 20. The select gate lines SGD and SGS connected to gates of the selection transistors ST1 and ST2 are formed around the semiconductor layers 20 on the word lines WL. Furthermore, one end of each semiconductor layer 20 is connected to the bit line BL, and the other end of each semiconductor layer 20 is connected to the source line SL.

Figure 7:
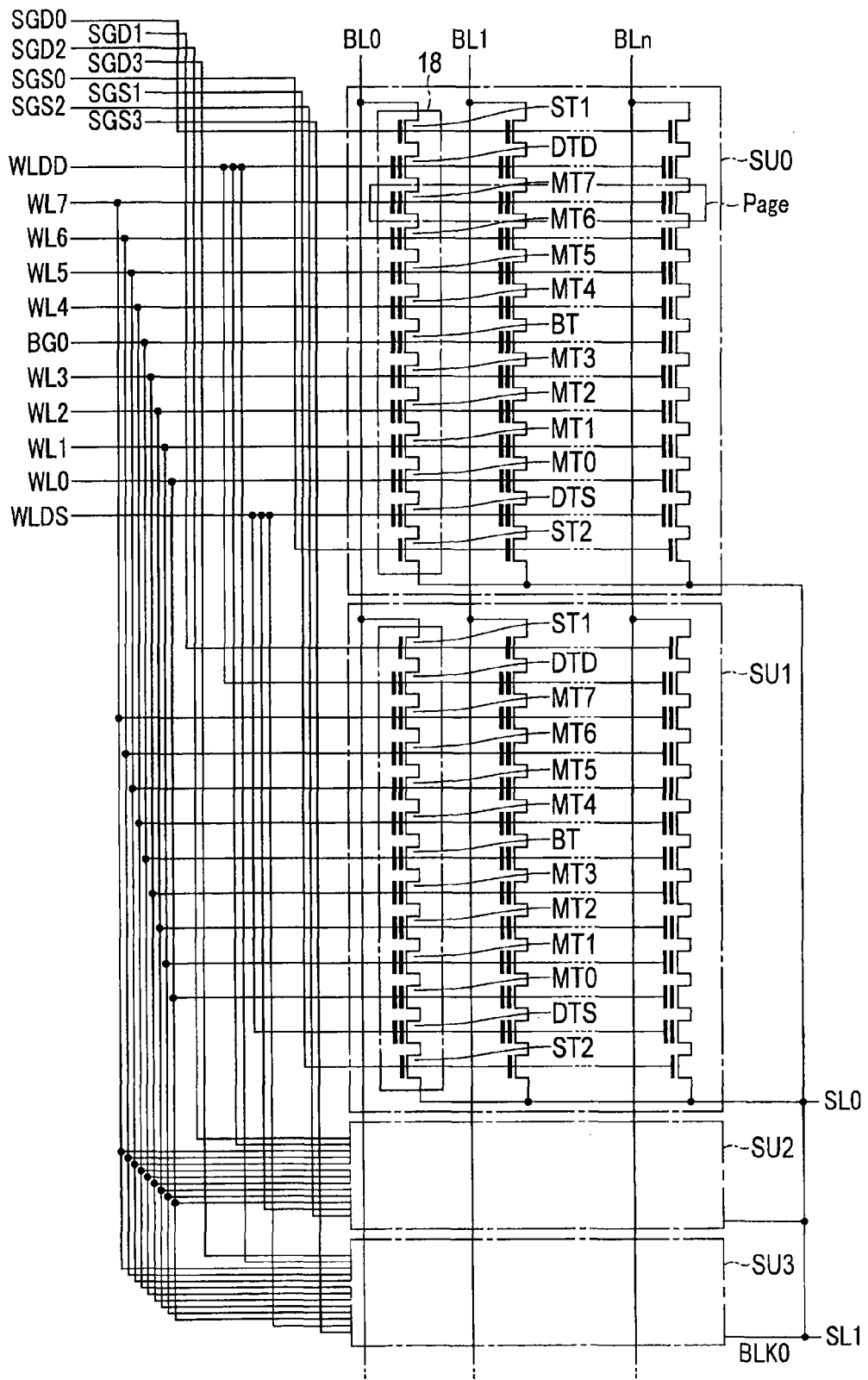
FIG. 7 is a circuit diagram of the memory cell array of the NAND flash memory having the three-dimensional structure.

FIG. 7 is a circuit diagram showing a configuration of the block in the memory cell array in the NAND flash memory having the three-dimensional structure. FIG. 7 shows a configuration of one block BLK0 in the memory cell array, but the other blocks BLK have the same configuration.

As described above, the block BLK0 includes string units SU. Moreover, each string unit SU includes (n+1 in this example, n is a natural number equal to 0 or more) NAND strings 18. Each of the NAND strings 18 includes, e.g., 8 memory cell transistors MT (MT0 to MT7), the selection transistors ST1 and sT2, the back gate transistor BT, and dummy cell transistors DTD and DTS.

Each memory cell transistor MT includes a stacked gate including a control gate and a charge storage layer, and holds data in a nonvolatile manner. It is to be noted that the number of the memory cell transistors MT is not restricted to 8, it may be 16, 32, 64, 128, or the like, and the number is not limited. The back gate transistor BT also includes a stacked gate including a control gate and a charge storage layer like the memory cell transistor MT. However, the back gate transistor BT is not configured to hold data, but it functions as a simple current path at the time of writing or erasing data. The memory cell transistors MT, the back gate transistor BT, and the dummy cell transistors DTD and DTS are arranged so that their current paths are connected in series between the selection transistors ST1 and ST2. It is to be noted that the back gate transistor BT is provided between the memory cell transistors MT3 and MT4. The current path of the dummy cell transistor DTD on one end side of the series connection is connected to one end of a current path of the selection transistor ST1, and the current path of the dummy cell transistor DTS on the other end side is connected to one end of the current path of the selection transistor ST2.

Gates of the selection transistors ST1 in the string units SU0 to SU(M−1) are connected to select gate lines SGD0 to SGD(M−1) in common, respectively. Gates of the selection transistors ST2 are connected to select gate lines SGS0 to SGS(M−1) in common, respectively. On the other hand, control gates of the memory cell transistors MT0 to MT7 in the same block BLK0 are connected to word lines WL0 to WL7 in common, respectively. Control gates of the back gate transistors BT are connected to back gate line BG (BG0 to BG(L−1) in the blocks BLK0 to BLK(L−1), respectively) in common. Control gates of the dummy cell transistors DTD and DTS are connected to word lines WLDD and WLDS in common, respectively.

That is, the word lines WL0 to WL7 and the back gate line BG are connected in common among the string units SU in the same block BLK0, whereas the select gate lines SGD and SGS are independent in accordance with each string unit SU even within the same block BLK0.

Additionally, in the NAND strings 18 arranged in the matrix form in the memory cell array, the other ends of the current paths of the selection transistors ST1 in the NAND strings 18 provided in the same column are connected to any bit line BL in common. That is, the bit line BL connects the NAND strings 18 in the same block BLK in common, and further connects the NAND strings 18 in the blocks BLK in common. Further, the other ends of the current paths of the selection transistors ST2 are connected to any source line SL. The source line SL connects the NAND strings 18 among the strings units SU in common, for example.

As described above, data of the memory cell transistors MT provided in the same block BLK are collectively erased. On the other hand, data is read or written collectively with respect to the memory cell transistors MT connected to any word line WL in common in any string unit SU in any block BLK. The unit serves as a "page".

FIG. 8 is a cross-sectional view of the memory cell array in the NAND flash memory having the three-dimensional structure called an i type.

As shown in the drawing, NAND strings 19 are arranged between the source line layer SL and the bit line BL above a semiconductor substrate. A semiconductor layer 26 in the NAND string 19 has one columnar shape (an i-like shape). The source line layer SL is formed above the semiconductor substrate, and columnar semiconductor layers 30a, 30b and 26 are formed on the source line layer. Furthermore, the selection transistor ST2, the memory cell transistors MT0 to MT7, and the selection transistor ST1 are formed around the semiconductor layers 30a, 30b, and 26 from the lower side in the mentioned order. Moreover, the bit line layer BL is formed on the semiconductor layer 30b.

Gate insulating films 25a, 25b, and 25c are formed on a side surface of the semiconductor layer 26, and the word lines WL0 to WL7 are formed on the gate insulating film 25a. The word lines WL0 to WL7 function as the control gates of the memory cell transistors MT0 to MT7, respectively. Gate insulating films 29a and 29b are formed on side surfaces of the semiconductor layers 30a and 30b respectively, and the select gate lines SGS and SGD are formed on the gate insulating films 29a and 29b, respectively. The select gate lines SGS and SGD function as gates of the selection transistors ST2 and ST1, respectively. It is to be noted that, in this configuration, the back gate transistor BT is not required.

FIG. 9 is a circuit diagram showing a configuration of the block in the memory cell array of the NAND flash memory having the i type three-dimensional structure. FIG. 9 shows a configuration of one block BLK0 in the memory cell array, but other blocks BLK have the same configuration.

The block BLK 0 includes (in this example, 2) string units SU0 and SU1. Additionally, each string unit SU includes (in this example, 4) NAND strings 19. Each of the NAND strings 19 includes, e.g., 64 memory cell transistors MT, the selection transistors ST1 and ST2, and the dummy transistors DTD and DTS. It is to be noted that FIG. 9 shows the dummy cell transistors DTD and DTS, but they are omitted in FIG. 8.

Each memory cell transistor MT includes a stacked gate including a control gate and a charge storage layer, and holds data in a non-volatile manner. It is to be noted that the number of the memory cell transistors MT is not restricted to 64, it may be 8, 16, 32, 128, or the like, and the number is not limited. The memory cell transistors MT and the dummy cell transistors DTD and DTS are arranged so that their current paths are connected in series between the selection transistors ST1 and ST2. The current path of the dummy cell transistor DTD on one end side of the series connection is connected to one end of a current path of the selection transistor ST1, and the current path of the dummy cell transistor DTS on the other end side is connected to one end of the current path of the selection transistor ST2.

Gates of the selection transistors ST1 in the strings units SU are connected to the select gate lines SGD0 and SGD1 in common, respectively. Gates of the selection transistors ST2 are connected to the select gate lines SGS0 and SGS1 in common, respectively. Control gates of the memory cell transistors MT in the row direction are connected to the word lines WL0 to WL63 in common, respectively. Control gates of the dummy cell transistors DTD and DTS are connected to the word lines WLDD and WLDS in common, respectively.

That is, the word lines WL0 to WL63 are connected among the string units SU in the same block BLK0 in common, whereas the select gate lines SGD and SGS are independent in accordance with each string unit SU even in the same block BLK0.

Further, the other ends of current paths of the selection transistors ST1 in the NAND strings 19 arranged in the row direction in the memory cell array are connected to any bit line BL. That is, the bit line BL connects the NAND strings 19 in the same block BLK in common, and further connects the NAND strings 19 in the blocks BLK in common. Furthermore, the other ends of electric paths of the selection transistors ST2 are connected to the source line SRC in common.

The configuration of the memory cell array 111 is described in, e.g., "Three-dimensional Stacked Nonvolatile Semiconductor Memory", U.S. patent application Ser. No. 12/407,403 filed on Mar. 19, 2009. Moreover, it is also described in "Three-dimensional Stacked Nonvolatile Semiconductor Memory", U.S. patent application Ser. No. 12/406, 524 filed on Mar. 18, 2009; "Nonvolatile Semiconductor Memory Device and Manufacturing Method Thereof", U.S. patent application Ser. No. 12/679,991 filed on Mar. 25, 2010; and "Semiconductor Memory and Manufacturing Method Thereof", U.S. patent application Ser. No. 12/532,030 filed on Mar. 23, 2009. These patent applications are entirely invoked in the specification by reference.

It is to be noted that all of the configuration shown in FIG. 5, the configuration shown in FIG. 6, and the configuration shown in FIG. 8 can be applied to the embodiment.

FIG. 10 shows an example of voltages applied to respective regions depicted in FIG. 5. In erasing, program, and read operations, such voltages as shown in FIG. 10 are supplied to the respective regions. Here, a voltage Vera is a voltage applied to the substrate in case of erasing data. A voltage Vss is a reference potential, e.g., a ground voltage, and a voltage Vdd is a power supply voltage. A voltage Vpgmh is a voltage applied to a gate of an N-channel MOS transistor in a row decoder at the time of writing data, and also a potential that enables passing a write voltage Vpgm of the word lines without decreasing by a threshold voltage of the N-channel MOS transistor. That is, the voltage Vpgmh is a voltage corresponding to the voltage Vpgm supplied to the word lines+Vth (Vth: the threshold voltage of the N-channel MOS transistor). A voltage Vreadh is a voltage applied to the gate of the N-channel MOS transistor in the row decoder at the time of reading, and also a potential that enables passing Vread without decreasing by the threshold voltage of the N-channel MOS transistor. That is, the voltage Vreadh is a voltage supplied to the word lines, and also a voltage that turns to Vread+Vth (Vth: the threshold voltage of the N-channel MOS transistor) at the time of reading.

Besides, there are Vpass as a voltage that is supplied to a word line of a non-selected cell at the time of writing data and Vread as a voltage supplied to a non-selected word line at the time of reading data.

Each of FIG. 11 and FIG. 12 shows an example of the data storage circuit 10 depicted in FIG. 3. The data storage circuit 10 includes a sense amplifier unit 10a depicted in FIG. 11 and a data control unit 10b depicted in FIG. 12.

As shown in FIG. 11, the sense amplifier unit 10a includes N-channel MOS transistors (which will be referred to as NMOS hereinafter) 21 to 27, P-channel MOS transistors (which will be referred to as PMOS hereinafter) 28 and 29, transfer gates 30 and 31, a latch circuit 31, and a capacitor 33. The latch circuit 32 includes, e.g., clocked inverter circuits 32a and 32b.

One end of a current path of the NMOS 21 is connected to a node to which the power supply Vdd is supplied. The other end of the current path of the NMOS 21 is grounded through the transfer gate 30, the NMOS 24, and the transfer gate 31. One end of a current path of the NMOS 25 is connected to a connection node between the NMOS 24 and the transfer gate 31. The other end of the NMOS 25 is connected to the bit line BL arranged in the memory cell array. Series circuits of the NMOS 22 and 23 are connected to the current path of the NMOS 21 in parallel.

Moreover, one end of a current path of the PMOS 28 is connected to a node to which a power supply voltage Vdd is supplied. The other end of the current path of the PMOS 28 is connected to an input end of the inverter circuit 32a constituting the latch circuit 32 through the PMOS 29 and grounded via the NMOS 26. An input end of the clocked inverter circuit 32b cross-connected to the inverter circuit 32a is connected to the data control unit 10b through the NMOS 27. Additionally, a gate of the PMOS 29 is connected to a connection node between the NMOS 22 and 23, and one end of the capacitor 33 is connected to this connection node. A clock signal CLK is supplied to the other end of this capacitor 33.

The control signal and control voltage generation circuit (which will be referred to as a generation circuit hereinafter) 7 supplies various kinds of control signals (e.g., signals BLX, LAT, INV, BLC, BLS, HLL, XXL, STB, RST, and NCO) to the inside of the sense amplifier unit 10a as described below.

The signal BLX is supplied to a gate of the NMOS 21. The signal LAT at an output terminal of the inverter circuit 32a constituting the latch circuit 32 is supplied to a gate of the NMOS constituting the transfer gate 30. The signal INV at an input terminal of the inverter circuit 32a is supplied to a gate of the PMOS constituting the transfer gate 30. The signal BLC is supplied to a gate of the NMOS 24. Additionally, the signal BLS is supplied to a gate of the NMOS 25.

The signal INV is supplied to a gate of the NMOS constituting the transfer gate 31. The signal LAT is supplied to a gate of the PMOS constituting the transfer gate 31.

The signal HLL is supplied to a gate of the NMOS 22, and the signal XXL is supplied to a gate of the NMOS 23. The signal STB is supplied to a gate of the PMOS 28, and the reset signal RST is supplied to a gate of the NMOS 26. Further, the signal NCO is supplied to a gate of the NMOS 27.

A write operation, a read operation, and a program verify read operation in the sense amplifier unit 10a will now be briefly described.

(Write Operation)

In case of writing data in the memory cells, the generation circuit 7 supplies the following control signals. First, the generation circuit 7 sets the signal STB to a high level (which will be referred to as an H level hereinafter), temporarily sets the reset signal RST to the H level, and resets the latch circuit 32. As a result, the signal LAT of the latch circuit 32 turns to the H level, and the signal INV of the same turns to a low level (which will be referred to as an L level hereinafter).

Then, the generation circuit 7 sets the signal NCO to the H level. Consequently, data is taken into the latch circuit 32 from the data control unit 10b. If this data is on the L level ("0"), the signal LAT is set to the L level, and the signal INV is set to the H level. Furthermore, if the data is on the H level ("1") indicative of non-writing, the data of the latch circuit 32 remains the same, the signal LAT is held at the H level, and the signal INV is held at the L level.

Subsequently, the generation circuit 7 sets the signals BLX, BLC, and BLS to the H level. Then, in case of writing, i.e., if the latch circuit has the L-level signal LAT and the H-level signal INV (writing), the transfer gate 30 is turned off, the transfer gate 31 is turned on, and the bit line BL has the ground voltage Vss. In the state, when the word line has the program voltage Vpgm, data is written into the memory cell.

On the other hand, in case of non-writing, i.e., if the latch circuit 32 has the H-level signal LAT and the L-level signal INV, the transfer gate 30 is turned on, the transfer gate 31 is turned off, and hence the bit line BL is charged with the power supply voltage Vdd. Here, if the word line has the program voltage Vpgm, a channel of the memory cell is boosted to a high potential, no data is written into the memory cell.

(Read Operation, Write Verify Operation)

In case of reading data from the memory cell, the generation circuit 7 supplies the following control signals. First, the generation circuit 7 temporarily sets the reset signal RST to the H level, and resets the latch circuit 32. Consequently, the signal LAT of the latch circuit 32 turns to the H level, and the signal INV of the same turns to the L level.

Then, the generation circuit 7 sets the signals BLS, BLC, BLX, HLL, and XXL to predetermined voltages. Consequently, the bit line BL is charged, and Node of the capacitor 33 is charged to the power supply voltage Vdd. Here, if a threshold voltage of the memory cell is higher than a read voltage level, the memory cell is in an OFF sate, and the bit line BL is held at the H level. That is, Node is held at the H level. Additionally, if the threshold voltage of the memory cell is lower than the read voltage level, the memory cell is in an ON state, and an electric charge in the bit line BL is discharged. Thus, the bit line BL changes to the L level. Consequently, Node also changes to the L level.

Subsequently, the generation circuit 7 sets the signal STB to the L level. Then, if the memory cell is ON, since Node is on the L level, the PMOS 29 is turned on. Consequently, the latch circuit 32 has the H-level signal INV and the L-level signal LAT. On the other hand, if the memory cell is in the OFF state, since Node is on the H level, the PMOS 29 is turned off. Consequently, the signal INV of the latch circuit 32 is held at the L level, and the signal LAT of the same is held at the H level.

Subsequently, the generation circuit 7 sets the signal NCO to the H level. Then, the NMOS 27 is turned on, and data in the latch circuit 32 is transferred to the data control unit 10b.

Further, after the write operation, the program verify operation of verifying the threshold voltage of the memory cell is carried out. The program verify operation is substantially the same as the read operation.

FIG. 12 shows an example of the data control unit 10b in the data storage circuit 10. The data control unit 10b shown in FIG. 12 includes an arithmetic circuit 40 and data latch circuits LDL, UDL, and XDL, and an NMOS 41.

The arithmetic circuit 40 includes a bus (which will be referred to as an IBUS hereinafter), transfer gates 42 and 43, a latch circuit 44, and a setting circuit 45. The transfer gates 42 and 43 are connected to both ends of the IBUS and complementarily operate. The latch circuit 44 latches data of the IBUS. The setting circuit 45 sets voltage levels of the data latch circuits LDL, UDL, and XDL in accordance with data of the latch circuit 44.

The transfer gate 42 operates based on complementary signals COND and CONS and connects a bus (which will be referred to as SBUS hereinafter) of the sense amplifier unit 10a with the IBUS. The transfer gate 43 operates based on the complementary signals CONS and COND and connects the IBUS with a bus (which will be referred to as DBUS hereinafter) having the data latch circuits LDL, UDL, and XDL connected thereto. The transfer gate 43 is OFF when the transfer gate 42 is ON, and the transfer gate 43 is ON when the transfer gate 42 is OFF.

The latch circuit 44 includes PMOS 46 to 49, NMOS 50 to 56, and an inverter circuit 68. A set signal SET is fed to gates of the PMOS 46 and the NMOS 50. A reset signal REST is supplied to a gate of the PMOS 48. A signal IFH is supplied to a gate of the NMOS 53. A signal IFL is supplied to a gate of the NMOS 55. A gate of the NMOS 54 is connected to the IBUS through the inverter circuit 68. Further, a gate of the NMOS 56 is connected to the IBUS.

The setting circuit 45 includes PMOS 57 to 60 and NMOS 61 to 64. A signal FAIL is supplied to a gate of the PMOS 57 and a gate of the NMOS 61. The signal FAIL is a signal of a connection node between the PMOS 47 and the NMOS 51 as one output terminal of the latch circuit 44. A signal MTCH is supplied to a gate of each of the PMOS 59 and the NMOS 63. The signal MTCH is a signal of a connection node between the PMOS 49 and the NMOS 52 as the other output terminal of the latch circuit 44. Additionally, a signal M2HB is supplied to a gate of the PMOS 58, and a signal F2HB is supplied to a gate of the PMOS 60. A signal F2L is supplied to a gate of the NMOS 62, and a signal M2L is supplied to a gate of the NMOS 64.

The data latch circuits LDL, UDL, and XDL have the same configuration, and each of these circuits includes a latch circuit 66 and a transfer gate 65 that connects the latch circuit 66 to the DBUS. Each transfer gate 65 is controlled by a signal BLCA, a complementary signal BLCA_B thereof, a signal BLCB, a complementary signal BLCB_B thereof, a signal BLCX, and a complementary signal BLCA_B thereof. The data latch circuit XDL is connected to an external IO through the NMOS 41. A signal CSL is supplied to a gate of the NMOS 41.

As described above, the data control unit 10b holds write data and also holds data read from a memory cell at the time of reading.

Write data of 2 bits supplied from the data input/output buffer 4 is latched by, e.g., the data latch circuits LDL and UDL bit by bit through the data latch circuit XDL.

The arithmetic circuit 40 shown in FIG. 12 can execute arithmetic operations such as AND, OR, exclusive NOR, and others with respect to data in the data latch circuits LDL and UDL. For example, in case of AND, data held in the data latch circuits LDL and UDL is output to the DBUS and the IBUS. In this case, the IBUS is set to the H level only when both pieces of data held in the data latch circuits LDL and UDL are "1", and the IBUS is set to the L level in any other case. That is, the IBUS is set to "1" at the time of non-writing only, and the IBUS is set to "0" at the time of writing. This data is transferred to the sense amplifier unit 10a shown in FIG. 11 via the SBUS, thereby performing writing.

The sense amplifier units 10a shown in FIG. 11 and the data latch circuits LDL, UDL, and XDL shown in FIG. 12 may be prepared, and each arithmetic circuit 40 shown in FIG. 12 may be arranged with respect to these sense amplifier units 10a and data latch circuits. Consequently, a circuit area can be reduced.

Operations of the arithmetic circuit 40 can be modified in many ways, various control methods can be applied to, e.g., one logical operation, and the control methods can be changed as required.

The NAND flash memory according to this embodiment is a multilevel memory. Thus, data of 2 bits can be stored in 1 cell. The 2 bits can be changed over based on addresses (a first page, a second page). In case of storing 2 bits in 1 cell, 2 pages are changed over. However, in case of storing 3 bits in 1 cell, the respective bits are changed over based on addresses (a first page, a second page, a third page). Further, in case of storing 4 bits in 1 cell, the bits are changed over based on addresses (a first page, a second page, a third page, a fourth page).

Figure 13:
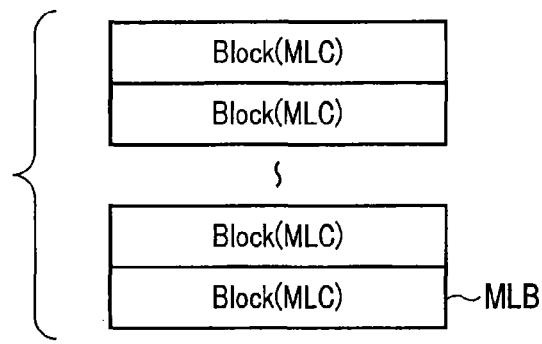
FIG. 13 is a view schematically showing a configuration of memory regions of the memory cell array in the first embodiment.

FIG. 13 schematically shows a configuration of memory regions in the memory cell array according to this embodiment. The memory cell array 1 has blocks as described above. In this embodiment, each of these blocks MLB includes a multilevel cell (MLC) that stores n bits in one memory cell.

Furthermore, in this embodiment, a description will be given as to a case where writing is collectively performed with respect to all cells aligned in the row direction as shown in FIG. 3.

Figure 14:
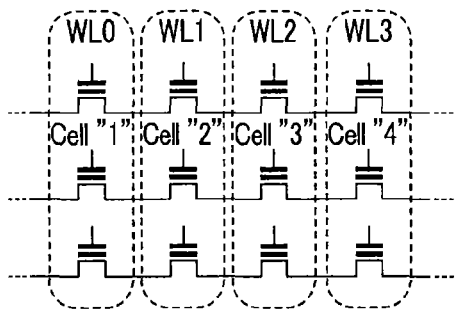
FIG. 14 is a view showing an example of a writing order of the memory cells in the first embodiment.

FIG. 14 shows an example of an order of writing in memory cells. In the NAND flash memory, memory cells are sequentially selected from the source line side and subjected to writing. That is, as shown in FIG. 14, the memory cells are selected in the order of "1", "2", "3", and "4".

Figure 15:
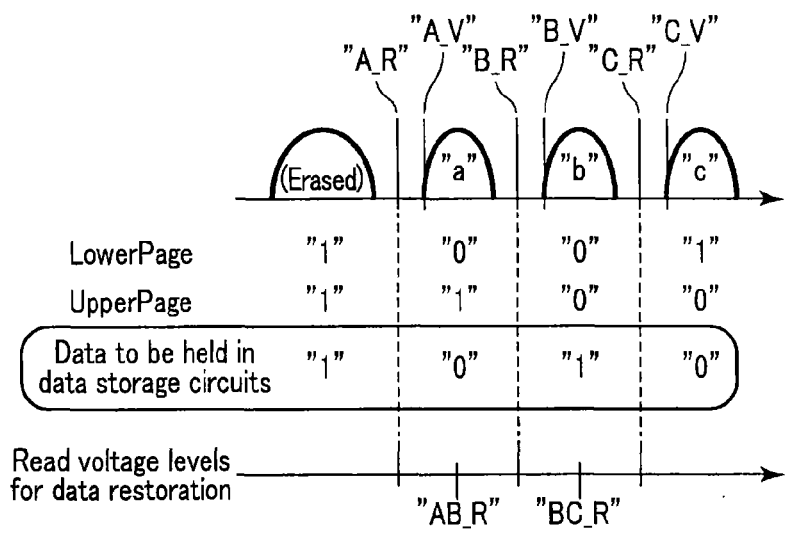
FIG. 15 is a view schematically showing threshold voltages written in the memory cells in a block MLB and read voltage levels in the first embodiment.

FIG. 15 schematically shows threshold voltages and read voltage levels for writing in each memory cell in the block MLB. Data in the memory cell turns to a threshold voltage "11" by the erase operation. Data of 2 bits, i.e., a lower page as the first page and an upper page as the second page is written in the memory cell, whereby the memory cell has any one of the threshold voltages "10" ("a"), "00" ("b"), and "01" ("c").

Moreover, read voltage levels "A_R", "B_R", and "C_R" between the respective threshold voltages are used for reading data. Verify voltage levels at the time of writing are A_V, B_V, and C_V which are slightly higher than the read voltage levels "A_R", "B_R", and "C_R" to provide data retention margins, respectively. That is, in this embodiment, the read voltage levels A_R, B_R, and C_R are used in the read operation, and the verify voltage levels A_V, B_V, and C_V are used in the write verify operation.

A program sequence in the first embodiment will now be described hereinafter. In the program sequence, as a countermeasure against a problem that the threshold value of the memory cell decreases due to detrapping immediately after a first write operation, a second write operation including a verify operation is performed to restore write data.

Figure 16:
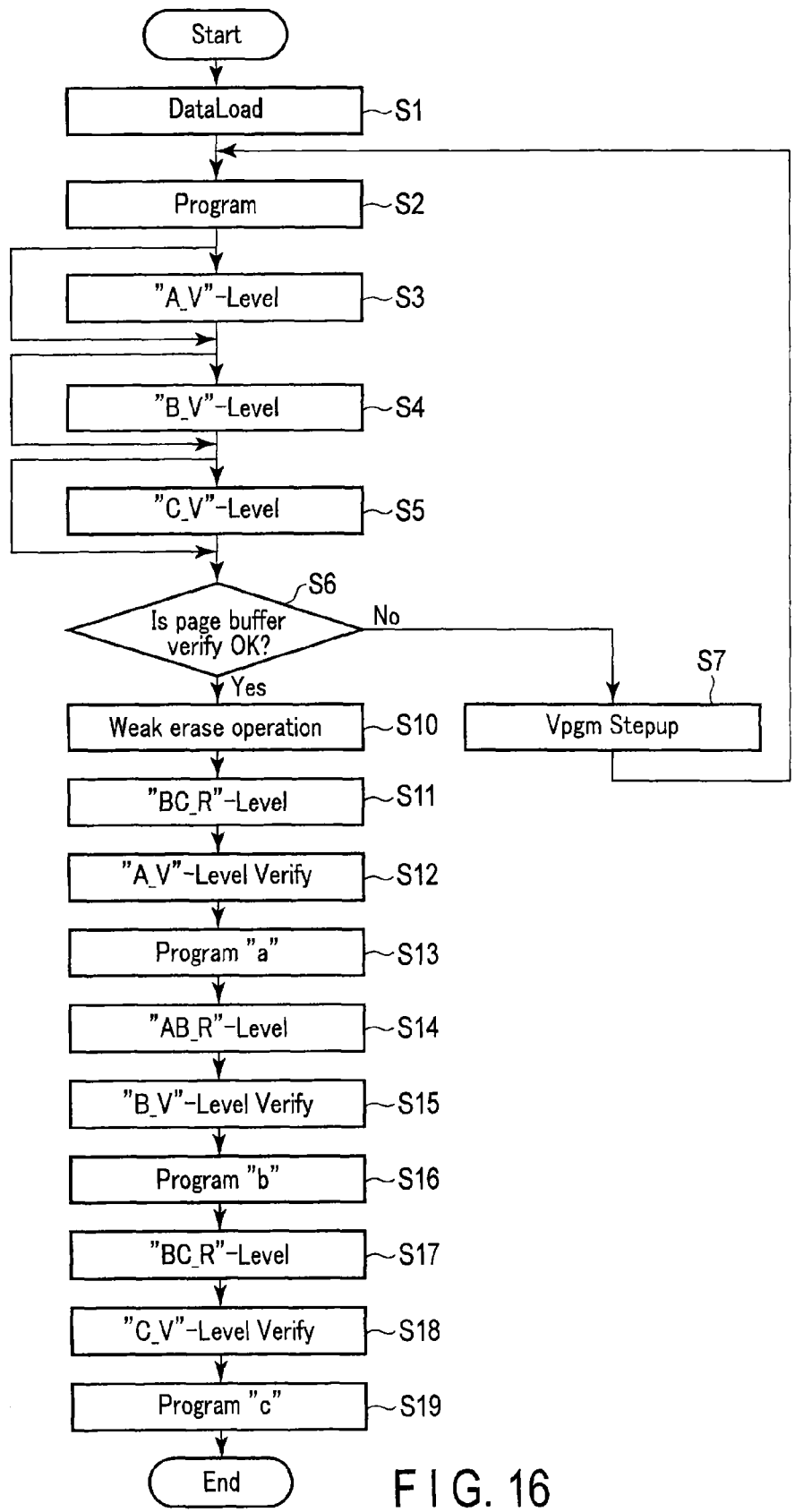
FIG. 16 is a flowchart showing a program sequence in the first embodiment.
Figure 17:
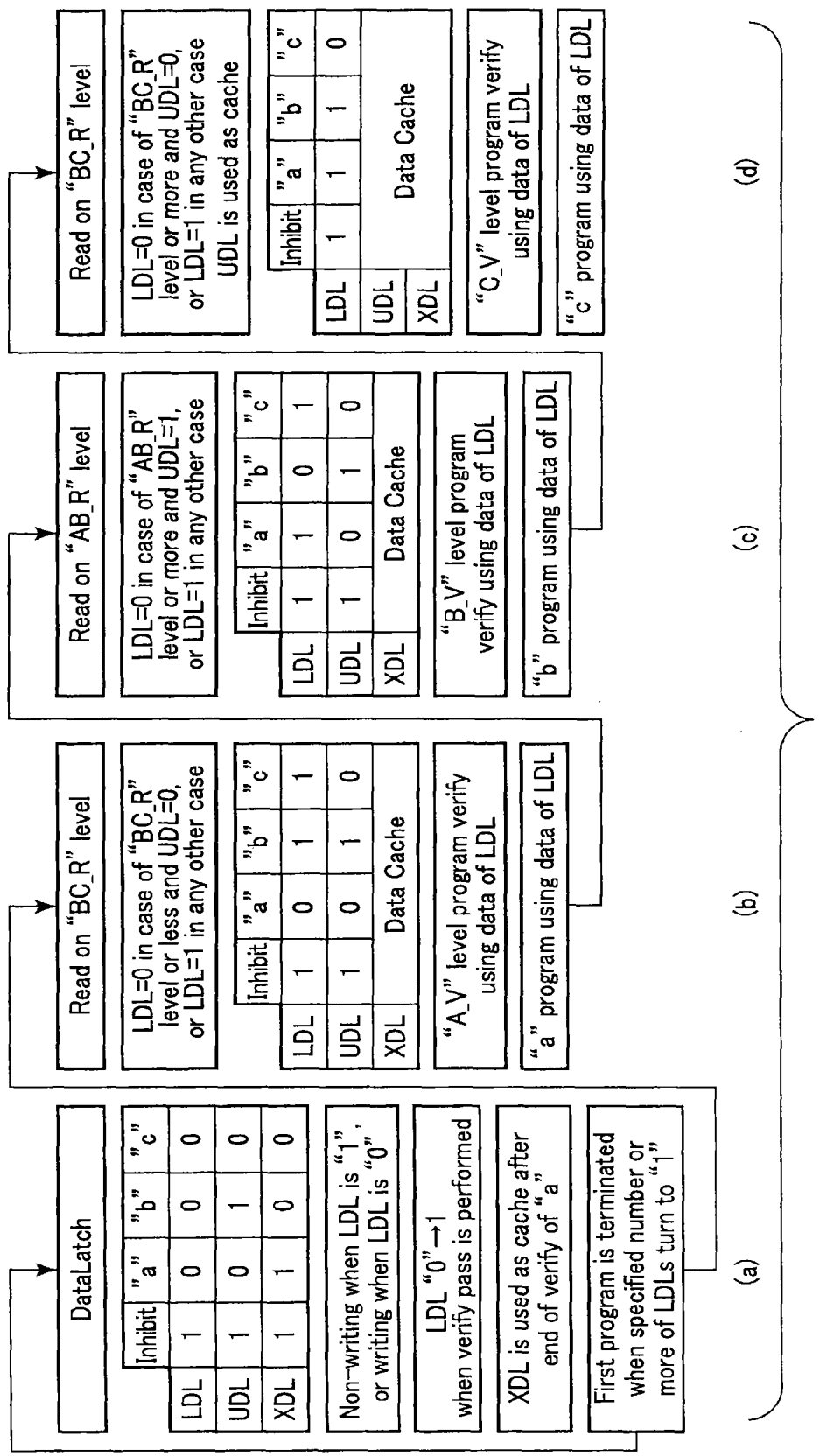
FIG. 17 is a view showing data held in a data latch circuit in the program sequence.
Figure 18:
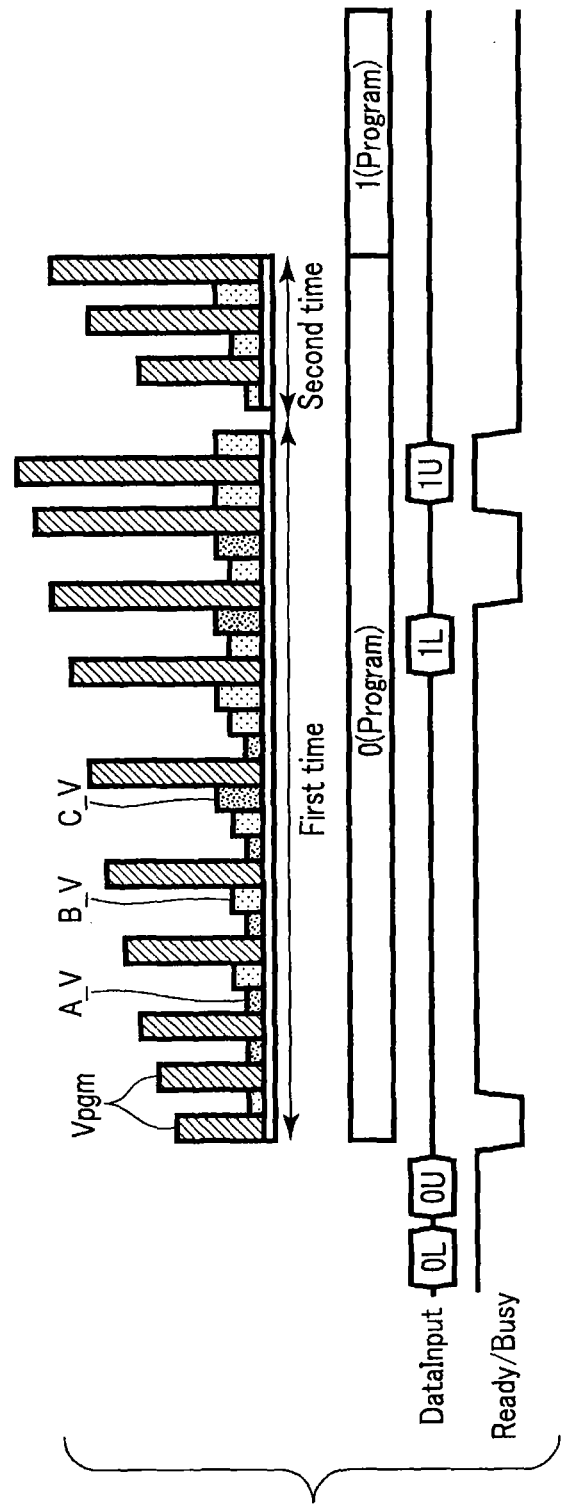
FIG. 18 is a view showing an example of a timing chart in the program sequence.

FIG. 16 is a flowchart showing the program sequence in the first embodiment. FIG. 17 shows data held in the data latch circuit in this program sequence. FIG. 18 shows an example of a timing charge at the time of writing.

The program sequence in the first embodiment includes the first write operation, a weak erase operation, and the second write operation.

(First Write Operation)

As shown in FIG. 18, first, when the H level indicating that a signal Ready/Busy is in ready state is set, a data controller in the control section 9 loads data of the lower page to the data latch circuit XDL (which will be referred to as XDL hereinafter) shown in FIG. 12. Then, the data in the XDL is transferred to the data latch circuit LDL (which will be referred to as LDL hereinafter). Subsequently, the data controller in the control section 9 loads data of the upper page to the XDL. Then, the data in the XDL is transferred to the data latch circuit UDL (which will be referred to as UDL hereinafter). In this manner, as represented by (a) in FIG. 17, the generation circuit 7 sets the data to the data latch circuits LDL, UDL, and XDL (a step S1 in FIG. 16).

Subsequently, the first write operation and the write verify operation are carried out based on the program sequence shown in FIG. 16. In the write operation, data "a", "b", and "c" are written in the memory cells (a step S2). At this time, the generation circuit 7 controls the write operation based on the data latched in the LDL. That is, the write operation is performed when the data in the LDL is 0, and the write operation is not performed when the data in the LDL is 1 (non-writing).

In the verify operation, reading is carried out with respect to the memory cells having the data "a", "b", and "c" with the use of the verify voltage levels A_V, B_V, and C_V (steps S3, S4, and S5). As a result of the verify operation, when a threshold voltage of a memory cell exceeds the verify voltage level, data in the LDL corresponding to this memory cell is set to "1" from "0". Then, whether the memory cells corresponding to data stored in a program buffer exceed the verify voltage levels is determined. That is, whether the number of the data latch circuits LDL set to "1" exceeds a specified number is determined (a step S6). When the number of the data latch circuits LDL set to "1" exceeds the specified number, the first write operation is terminated.

On the other hand, when the number of the data latch circuits LDL set to "1" is less than the specified number, the write voltage Vpgm is slightly increased (step-up), the processing returns to the step S2, and the write operation of the step S2 and subsequent processing are repeated. Consequently, the write operation and the write verify operation are alternately repeated until the number of the data latch circuits LDL set to "1" becomes the specified number or more.

Here, since writing begins from memory cells having lower threshold values in the write operation, when there is no memory cell which is to be written with the data "a", the data latch circuit XDL does not have to latch data for the second write operation. Thus, as shown in FIG. 18, the signal Ready/Busy changes to the H level, and subsequent write data is transferred to the data latch circuit XDL. That is, the data latch circuit XDL is used as a cache for the subsequent write data. Consequently, high-speed writing can be realized.

After end of the first write operation, the weak erase operation is performed with respect to the memory cells (a step S10).

The weak erase operation is an operation of applying weak voltage stress (which will be referred to as reverse stress hereinafter) in the same direction as an erase voltage applied to the memory cells at the time of a data erase operation. In the weak erase operation, a weak erase voltage (the reverse stress) in a direction opposite to a write voltage applied to the memory cells in the first and second write operations is applied to the memory cells. For example, a voltage of a selected word line is determined as 0 V, and a channel potential of each memory cell is determined as a positive voltage. Consequently, the reverse stress (a reverse pulse) is applied to the memory cell. It is to be noted that a detailed operation of the weak erase operation will be described later.

(Second Write Operation)

As described above, when the specified number or more of the data latch circuits LDL are set to "1", the first write operation is completed. Then, the weak erase operation is executed, and the generation circuit 7 sets data of 1 bit generated from write data (data of a lower page and an upper page) in the data latch circuits UDL after end of the weak erase operation. For example, the arithmetic circuit 40 executes an arithmetic operation of exclusive NOR with respect to the data in the data latch circuits LDL and UDL and sets an arithmetic result ("1", "0", "1", and "0") in the data latch circuits UDL as represented by (a) in FIG. 17.

Then, such a second write operation as shown in FIG. 16 and (b), (c), and (d) in FIG. 17 is executed.

First, to perform writing with respect to the memory cell having the data "a", the following operation is executed. As shown in FIG. 16 and (b) in FIG. 17, the memory cell that should have the data "a" is read by using a read voltage level BC_R (a step S11). The read voltage level BC_R is a voltage level between the read voltage levels B_R and C_R. When a threshold value of the memory cell subjected to the reading is equal to or less than BC_R and data of the UDL is "0", data of the LDL corresponding to the memory cell is set to "0". As other conditions, the data of the LDL corresponding to the memory cell is set to "1".

Then, when the data of the LDL is 0, the generation circuit 7 executes the verify operation with respect to the memory cell corresponding to the LDL with the use of the verify voltage level A_V (a step S12). Subsequently, as a result of the verify operation, writing to set the data "a" is executed with respect to the memory cell whose memory cell threshold value is equal to the verify voltage level A_V or less (a step S13).

Subsequently, to again perform writing with respect to the memory cell having the data "b", the following operation is executed. As shown in FIG. 16 and (c) in FIG. 17, the memory cell that should have the data "b" is read by using a read voltage level AB_R (a step S14). The read voltage level AB_R is a voltage level between the read voltage levels A_R and B_R. When a threshold value of the memory cell subjected to reading is equal to the read voltage level AB_R or more and data of the UDL is 1, data of the LDL corresponding to the memory cell is set to "0". As other conditions, the data of the LDL corresponding to the memory cell is set to "1".

Subsequently, when the data of the LDL is 0, the generation circuit 7 executes the verify operation with respect to the memory cell corresponding to the LDL by using the verify voltage level B_V (a step S15). Then, writing for setting the data "b" is executed with respect to the memory cell whose memory cell threshold value is found to be equal to the verify voltage level B_V or less as a result of the verify operation (a step S16).

Subsequently, to again perform writing with respect to the memory cell having the data "c", the following operation is executed. As shown in FIG. 16 and (d) in FIG. 17, the memory cell that should have the data "c" is read by using a read voltage level BC_R (a step S17). The read voltage level BC_R is a voltage level between the read voltage levels B_R and C_R. When a threshold value of the memory cell subjected to reading is equal to the read voltage level BC_R or more and data of the UDL is 0, data of the LDL corresponding to the memory cell is set to "0". As other conditions, the data of the LDL corresponding to the memory cell is set to "1".

Here, the data latch circuit UDL does not have to latch data for the second write operation. Thus, if subsequent write data (corresponding to 1 page) has been transferred to the data latch circuit XDL from the outside, the data in the data latch circuit XDL is transferred to the data latch circuit UDL. Therefore, as shown in FIG. 18, the signal Ready/Busy changes to the H level, and the subsequent write data (corresponding to 1 page) is transferred to the data latch circuit XDL. That is, the data latch circuits XDL and UDL are used as caches for the subsequent write data corresponding to 2 pages. Consequently, high-speed writing can be realized.

Subsequently, when data in the LDL is 0, the verify operation is executed with respect to a memory cell corresponding to the LDL by using the verify voltage level C_V (a step S18). Then, in the verify operation, writing to set the data "c" is executed with respect to the memory cell whose memory cell threshold value is equal to the verify voltage level C_V or less (a step S19).

According to the first embodiment described above, to restore the write data written in the memory cells having the data "a", "b", and "c", which one of the data "a", "b", and "c" each of the read memory cells has is determined based on a result of reading using the voltage AB_R between the read voltage levels A_R (the read voltage level for the data "a") and B_R (the read voltage level for the data "b") and the voltage BC_R between the read voltage levels B_R and C_R (the read voltage level for the data "c"), and writing is executed with respect to each of the voltage levels of the data "a", "b", and "c". As a result, it is possible to provide the semiconductor memory device that can suppress an influence of fluctuations in threshold values immediately after writing in the memory cells and enables high-speed writing.

Figure 19:
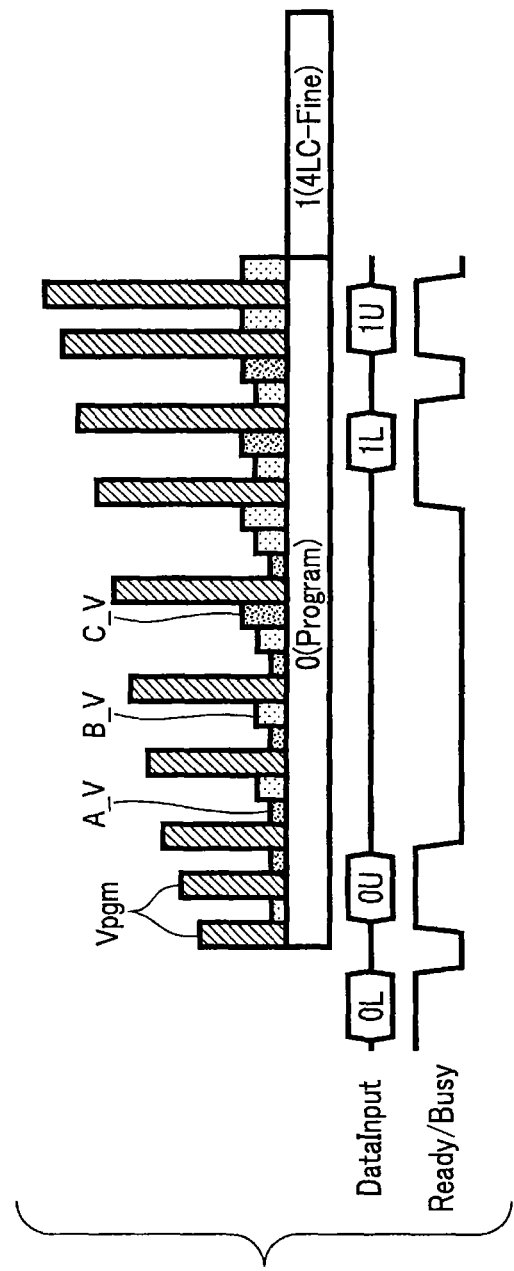
FIG. 19 is a view showing another example of the timing chart in the program sequence.

It is to be noted that, in the first embodiment, although the write operation is executed after inputting data corresponding to 2 pages, i.e., data 0L of the lower page and data 0U of the upper page, since the data "a" can be written when the data of the lower page is input as shown in FIG. 15, writing of the data "a" may be first started, then the data of the upper page may be input, and thereafter the data "a", "b", and "c" may be written. FIG. 19 shows a sequence chart of this example. As shown in the drawing, before inputting the data 0L of the lower page and inputting the data 0U of the upper page, the write operation may be started.

Furthermore, the verify voltage level in the second write operation may be replaced with the verify voltage level effected in the first write operation. Moreover, the program voltage Vpgm and a pulse time for applying the program voltage Vpgm may be changed. Moreover, after the second write operation, the second write operation may be repeated more than once.

Additionally, if the memory cell has a threshold value that is unstable due to, e.g., detrapping of an electric charge by performing the weak erase operation after the first write operation and before the second write operation, the threshold value of the memory cell is lowered at this point of time. Further, rewriting is executed with respect to the memory cell in the second write operation. Consequently, the write operation in which a threshold value distribution of the memory cell hardly decreases can be carried out.

In the program sequence shown in FIG. 16, although the weak erase operation of the step S10 is executed between the step S6 and the step S11, the weak erase operation may be executed between the step S11 and the step S12. The weak erase operation may be executed with respect to the memory cell which passed the verify operation in the first write operation. The weak erase operation also may be executed with respect to the memory cell in which data "a", "b" or "c" to be written.

Operation waveforms of the write operation, the read operation, and the write verify operation in the program sequence according to the embodiment will now be described hereinafter.

Figure 20:
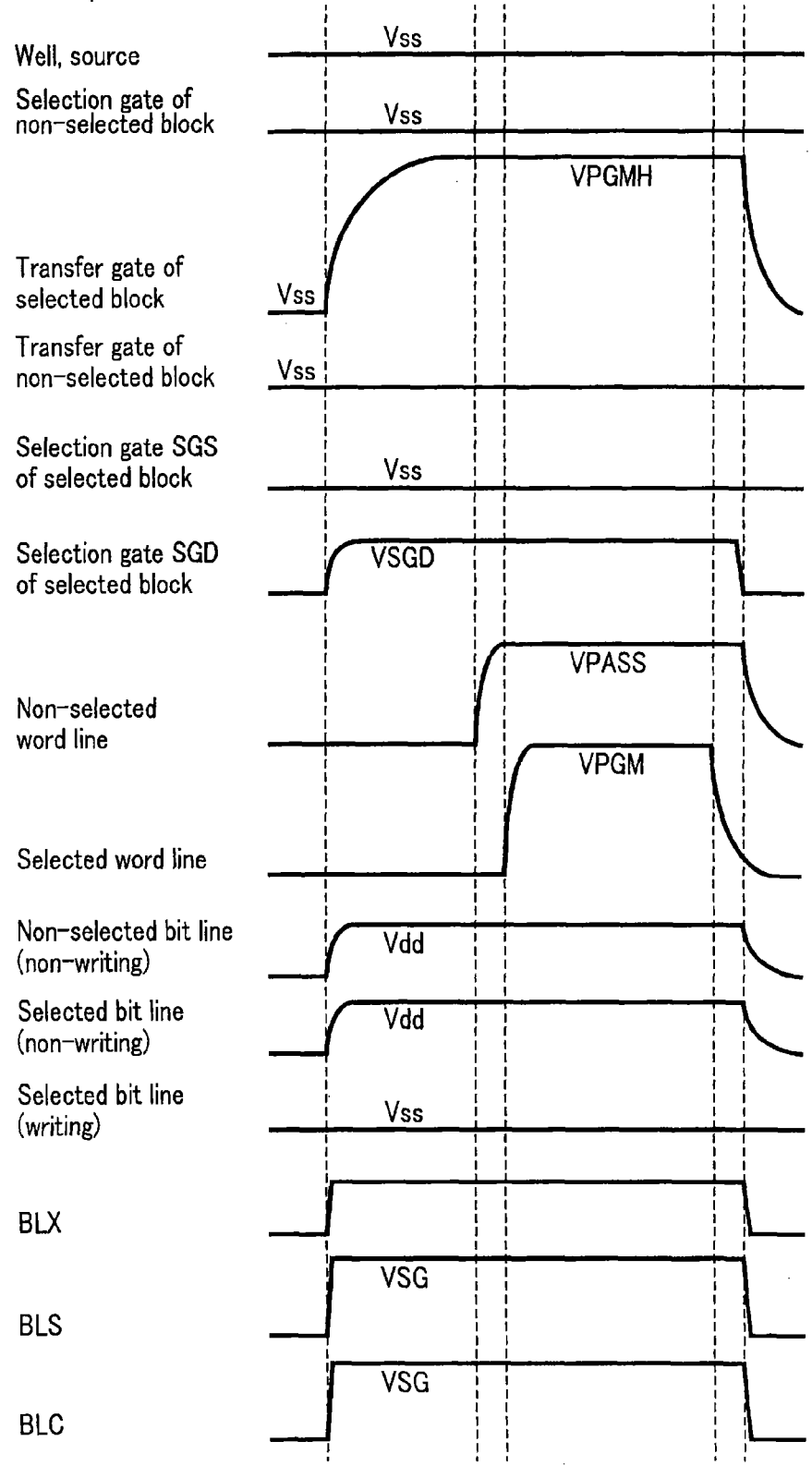
FIG. 20 is an operation waveform chart showing a write operation in the program sequence.
Figure 21:
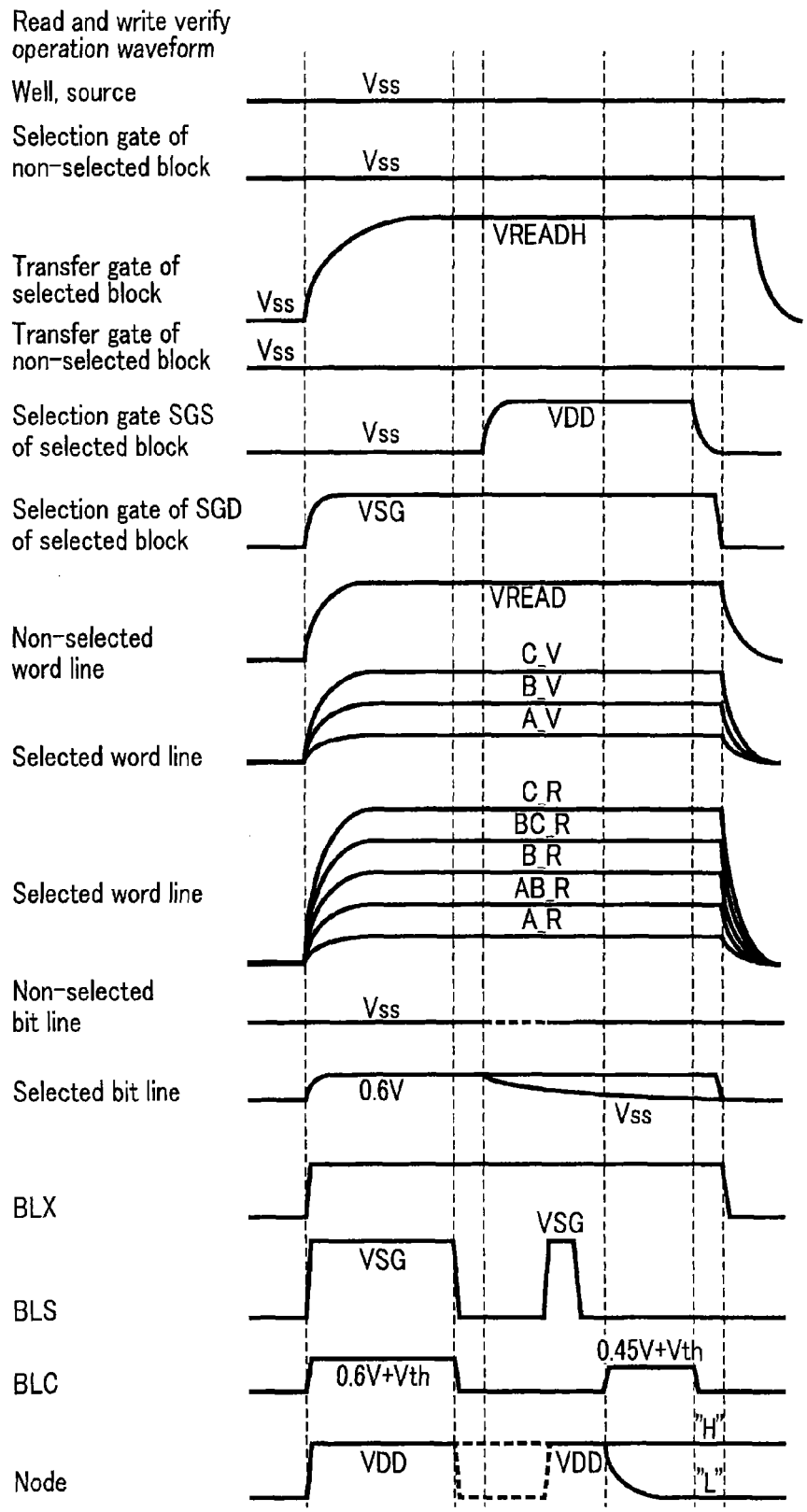
FIG. 21 is an operation waveform chart showing a read operation and a write verify operation in the program sequence.

FIG. 20 and FIG. 21 show operation waveforms of the write operation, the read operation, and the write verify operation in the program sequence.

For example, in the write operation of the step S2 shown in FIG. 16, the write voltage Vpgm is applied to a selected word line as shown in FIG. 20. In the write verify operation of the steps S3, S4, and S5, the verify voltage levels A_V, B_V, and C_V are applied to selected word lines, respectively as shown in FIG. 21.

Furthermore, in the write verify operation of the steps S11 and S17 shown in FIG. 16, the read voltage level BC_R between the read voltage levels B_R and C_R is applied to a selected word line as shown in FIG. 21. In the write verify operation of the step S14, the read voltage level AB_R between the read voltage levels A_R and B_R is applied to a selected word line as shown in FIG. 21.

In the write verify operation of the steps S12, S15, and S18, the same verify voltage levels A_V, B_V, and C_V as those of the steps S3, S4, and S5 may be applied, or slightly different values may be applied to selected word lines as shown in FIG. 21.

A modification of the first embodiment will now be described.

Figure 23:
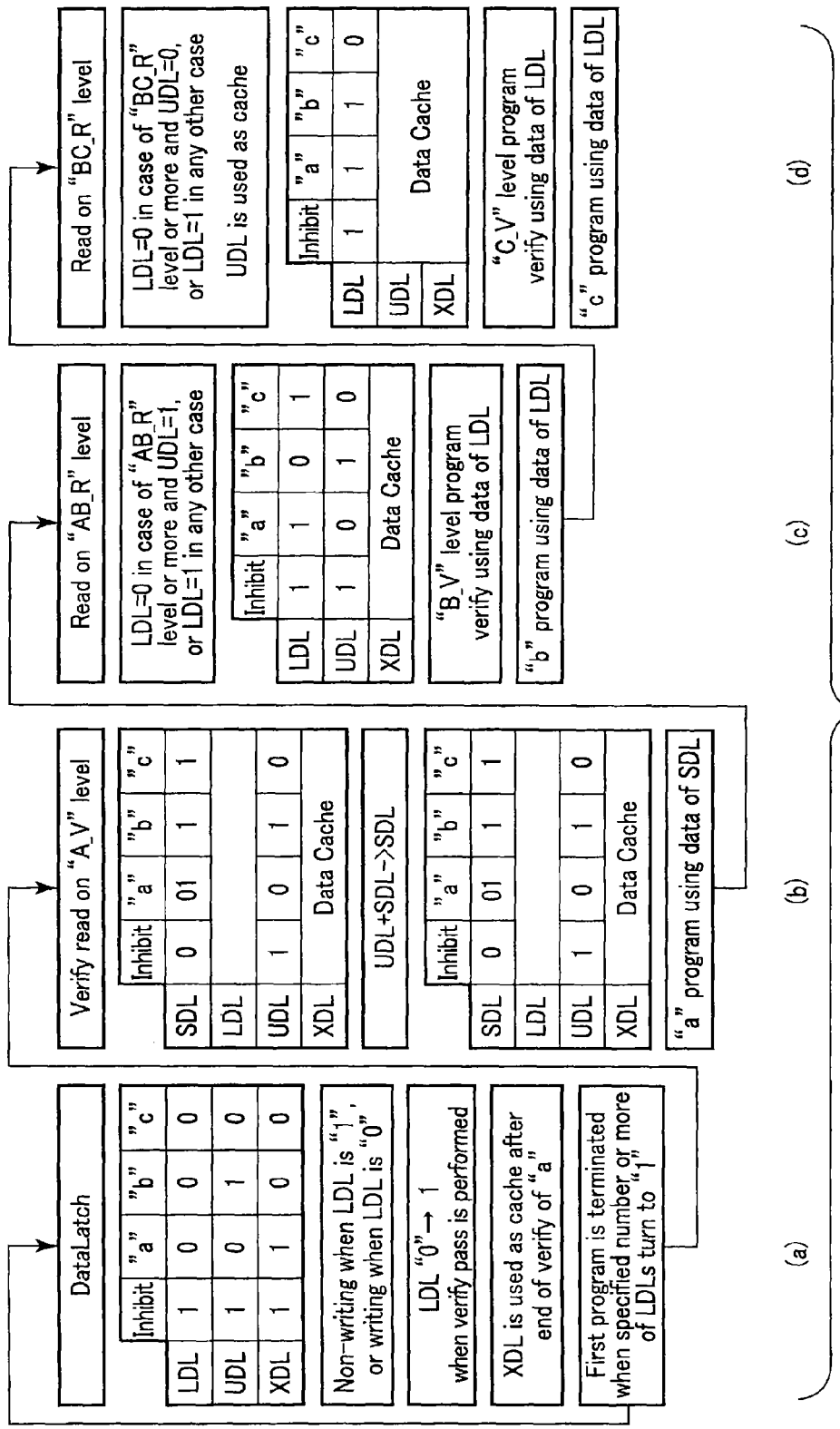
FIG. 23 is a view showing data held in data latch circuits in the program sequence.

FIG. 22 is a flowchart showing a program sequence according to the modification of the first embodiment. FIG. 23 shows data held in the data latch circuits in the program sequence. Other structures are the same as those in the first embodiment.

A first write operation and a weak erase operation in the program sequence according to this modification are the same as the first embodiment, and hence a description thereof will be omitted. Here, a second write operation executed after the weak erase operation will be described. It is to be noted that particulars of the weak erase operation will be described later.

(Second Write Operation)

As described above, when a specified number or more of the data latch circuits LDL are set to "1", a first write operation is completed. Then, the weak erase operation is executed, and "1", "0", "1", and "0" are set to the data latch circuit UDL after end of this weak erase operation as represented by (a) in FIG. 23 like the first embodiment. Thereafter, such a second write operation as shown in FIG. 22 and (b), (c), and (d) in FIG. 23 is executed.

First, to again perform writing in each memory cell having data "a", the following operation is executed. In this modification, as shown in FIG. 22 and (b) in FIG. 23, after end of the first write operation, the verify operation is executed using the verify voltage level A_V (a step S12).

In the first embodiment, as represented by (b) in FIG. 17, after end of the first write operation, the memory cells are read by using the data stored in the data latch circuits UDL and the read voltage level BC_R, thereby classifying the memory cells having the data "a" and "c". Additionally, the verify operation is executed with the use of the verify voltage level A_V to select the memory cell having the data "a" whose threshold value is lower than the verify voltage level A_V. However, it is unlikely that the threshold value of the memory cell having the data "c" decreases to reach the verify voltage level A_V or less and, even if writing to set the data "a" is performed with respect to the memory cell having the data "c" equal to the verify voltage level A_V or less, an influence on the memory cell having the data "c" is small. Thus, in this example, reading using the read voltage level BC_R is eliminated, and the verify operation is executed with the use of the verify voltage level A_V.

As shown in FIG. 11, the data latch circuits SDL (32a, 32b) (which will be referred to as SDL hereinafter) are prepared in the data storage circuit 10. In the data latch circuits SDL, "0" is latched when a threshold level of each memory cell is lower than the verify voltage level A_V as a result of the verify operation using the verify voltage level A_V, or "1" is latched when the threshold level of each memory cell is higher than the verify voltage level A_V as a result of the same.

Subsequently, the data latched in the UDL and the SDL are subjected to an OR operation, and its result is stored in the SDL.

Then, when data in the SDL is 0, namely, the generation circuit 7 executes writing to set the data "a" with respect to memory cells which are to be written with the data "a" or the data "c" have memory cell threshold values equal to the verify voltage level A_V or less (the step S13). Subsequent operations represented by (c) and (d) in FIG. 23 are the same as the first embodiment.

In the modification according to the first embodiment, omitting the read operation for discriminating the memory cells which are to be written with the data "a" and the memory cells which are to be written with the data "c" enables reducing the operations in the program sequence beyond the first embodiment, thereby realizing high-speed writing. Other structures and effects are the same as the first embodiment.

Second Embodiment

A semiconductor memory device according to a second embodiment will now be described.

Figure 24:
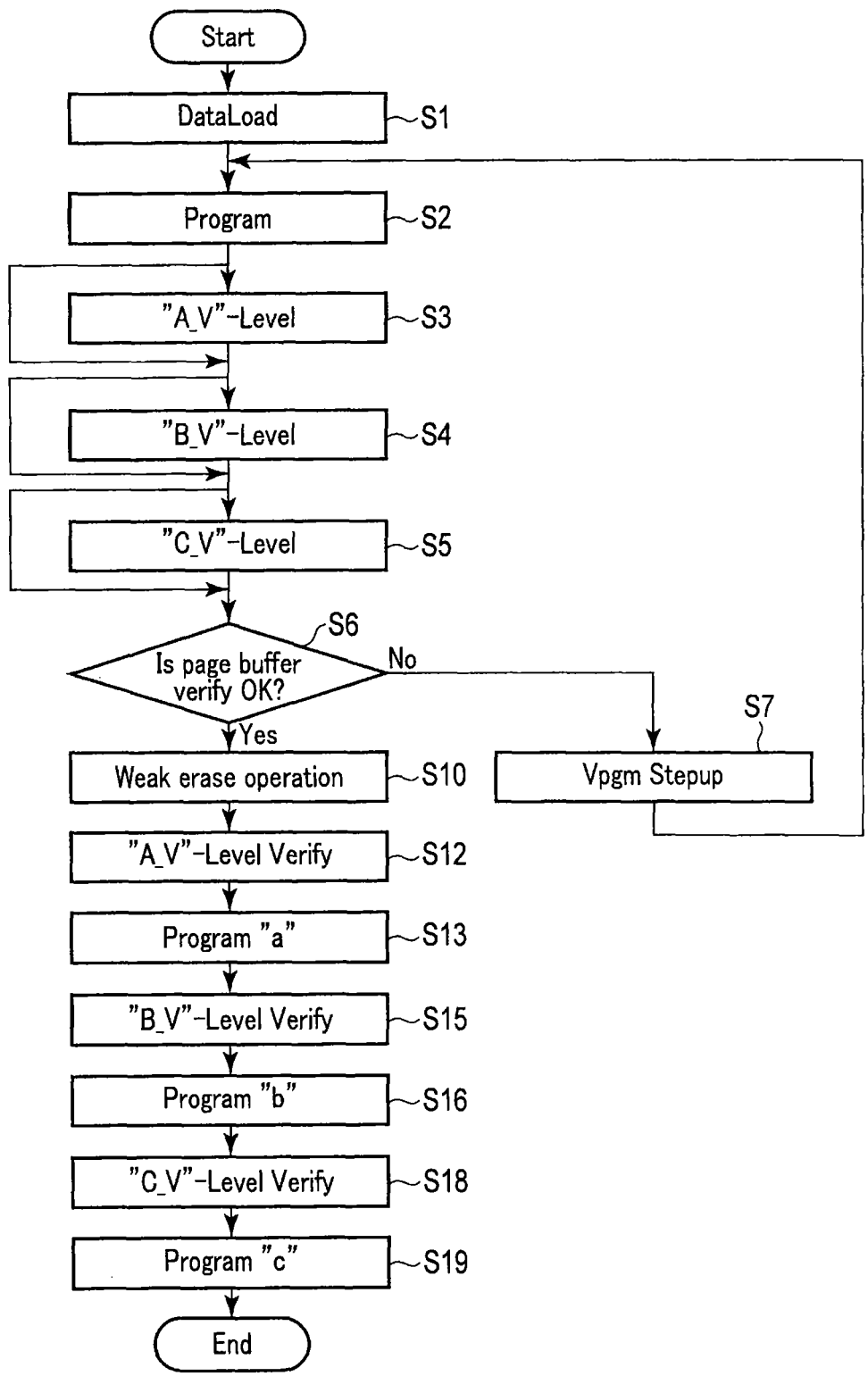
FIG. 24 is a flowchart showing a program sequence according to a second embodiment.
Figure 25:
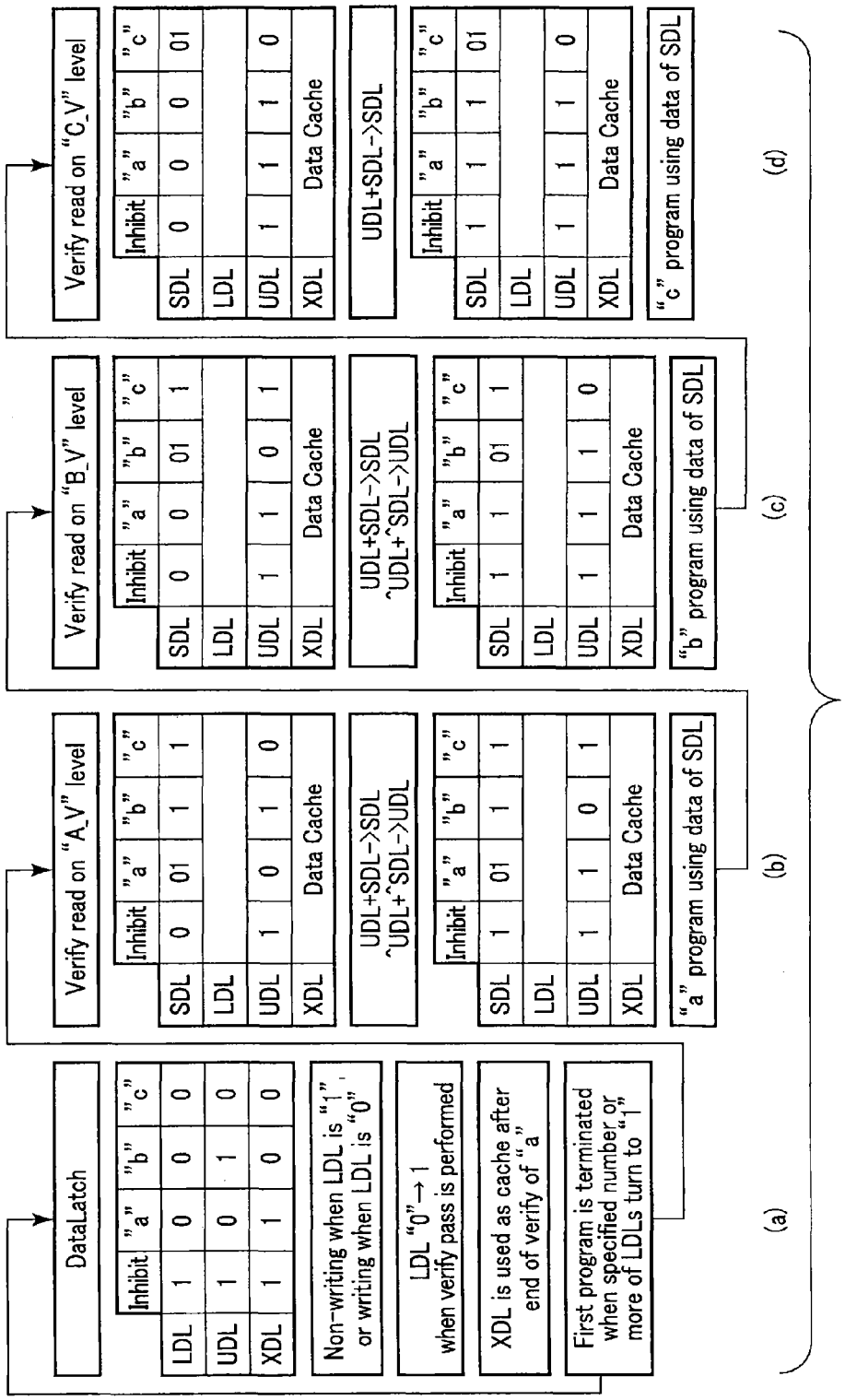
FIG. 25 is a view showing data held in data latch circuits in the program sequence.

FIG. 24 is a flowchart showing a program sequence according to the second embodiment. FIG. 25 shows data held in data latch circuits at the time of the program sequence. Other structures are the same as the first embodiment.

A first write operation and a weak erase operation in the program sequence according to the second embodiment are the same as the first embodiment, and a second write operation executed after the weak erase operation will be described here. It is to be noted that particulars of the weak erase operation will be described later.

(Second Write Operation)

As described above, when a specified number or more of data latch circuits LDL are set to "1", the first write operation is completed. Then, the weak erase operation is executed, and "1", "0", "1", and "0" are set to a data latch circuit UDL after end of the weak erase operation as represented by (a) in FIG. 25 like the first embodiment. Thereafter, such a second write operation as shown in FIG. 24 and (b), (c), and (d) in FIG. 25 is executed.

Here, the data latch circuit LDL does not have to latch data for the second write operation. Thus, if next write data (corresponding to 1 page) has been transferred to a data latch circuit XDL from the outside, data in the data latch circuit XDL is transferred to the data latch circuit LDL. Therefore, as shown in FIG. 18, a signal Ready/Busy is set to an H level, and the next write data (corresponding to 1 page) is transferred to the data latch circuit XDL. That is, the data latch circuits XDL and LDL are used as caches for the next write data corresponding to 2 pages. Consequently, high-speed writing can be realized.

First, to again perform writing with respect to a memory cell having the data "a", the following operation is executed. In this second embodiment, as shown in FIG. 24 and (b) in FIG. 25, after completion of the first write operation, like the modification of the first embodiment, a verify voltage level A_V is used to execute a verify operation (a step S12).

In the data latch circuits SDL, "0" is latched when a threshold level of the memory cell is lower than the verify voltage level A_V as a result of the verify operation using the verify voltage level A_V, or "1" is latched when the threshold level of the memory cell is higher than the verify voltage level A_V as a result of the same.

Then, a result of performing an OR operation to data latched in the UDL and the SDL and a result of performing the OR operation to inverted data of the data latched in the UDL and the SDL are stored in the SDL and the UDL, respectively. Here, the UDL turns to 0 when the UDL originally holds data "1" (i.e., a memory cell of write Inhibit and a cell which is to be written with data "b") and has the verify voltage level A_V or a higher level, but the memory cell of write Inhibit is unlikely to have a threshold value of the verify voltage level A_V or a higher level, only the cell which is to be written with the data "b" remains.

Then, a generation circuit 7 executes writing to provide the data "a" when the data in the SDL is 0, namely, with respect to a memory cell which is to be written with the data "a" or the data "c" and has a memory cell threshold value equal to the verify voltage level A_V or less (a step S13).

Then, to again perform writing with respect to the memory cell having the data "b", the following operation is executed. As shown in FIG. 24 and (c) in FIG. 25, the verify operation is executed with the use of a verify voltage level B_V (a step S15). In the data latch circuit SDL, "0" is latched when a threshold level of the memory cell is lower than the verify voltage level B_V as a result of the verify operation using the verify voltage level B_V, or "1" is latched when the threshold level of the memory cell is higher than the verify voltage level B_V as a result of the same.

Subsequently, a result of performing the OR operation to the data latched in the UDL and the SDL and a result of performing the OR operation to inverted data of the data latched in the UDL and SDL are stored in the SDL and the UDL, respectively. Here, the UDL turns to 0 when the UDL originally holds data "1" (i.e., a memory cell of write Inhibit or cells which are to be written with data "a" and "c") and has the verify voltage level B_V or a higher level, but the memory cell of write Inhibit or the cell which is to be written with the data "a" is unlikely to have a threshold value of the verify voltage level B_V or a higher level, only the cell which is to be written with the data "c" remains.

Then, the generation circuit 7 executes writing to provide the data "b" when the data in the SDL is 0, namely, with respect to the memory cell that is to be written with the data "b" and has a memory cell threshold value equal to the verify voltage level B_V or less (a step S16).

Then, to again perform writing with respect to the memory cell having the data "c", the following operation is executed. As shown in FIG. 24 and (d) in FIG. 25, the verify operation is executed with the use of a verify voltage level C_V (a step S18). In the data latch circuit SDL, "0" is latched when a threshold level of the memory cell is lower than the verify voltage level C_V as a result of the verify operation using the verify voltage level C_V, or "1" is latched when the threshold level of the memory cell is higher than the verify voltage level C_V as a result of the same.

Subsequently, the data latched in the UDL and the SDL are subjected to the OR operation, and its result is stored in the SDL and the UDL.

Then, the generation circuit 7 executes writing to provide the data "c" when the data in the SDL is 0, namely, with respect to a memory cell which is to be written with the data "c" and has a memory cell threshold value equal to the verify voltage level C_V or less (a step S19).

Here, the data latch circuit UDL does not have to latch data for the second write operation. Thus, the UDL can be used as, e.g., a data latch circuit that holds next write data.

Further, the verify voltage level of the second write operation may be replaced with the verify voltage level effected in the first write operation. Moreover, a program voltage Vpgm and a pulse time for applying the program voltage Vpgm may be changed.

After the writing to provide the data "c", the program sequence is terminated, but the second write operation may be repeated more than once.

In the second embodiment, the reading using the read voltage level AB_R in the first embodiment uses a result of the verify operation adopting the verify voltage level A_V and the reading using the read voltage level BC_R uses a result of the verify operation adopting the verify voltage level B_V in the same, thereby omitting a time required for preliminary reading adopting the read voltage levels AB_R and BC_R. Consequently, high-speed reading can be realized. Other structures and effects are the same as those in the first embodiment.

Third Embodiment

A semiconductor memory device according to a third embodiment will now be described. In the third embodiment, the first write operation and the second write operation described in the first embodiment are executed in different sequences.

Figure 26:
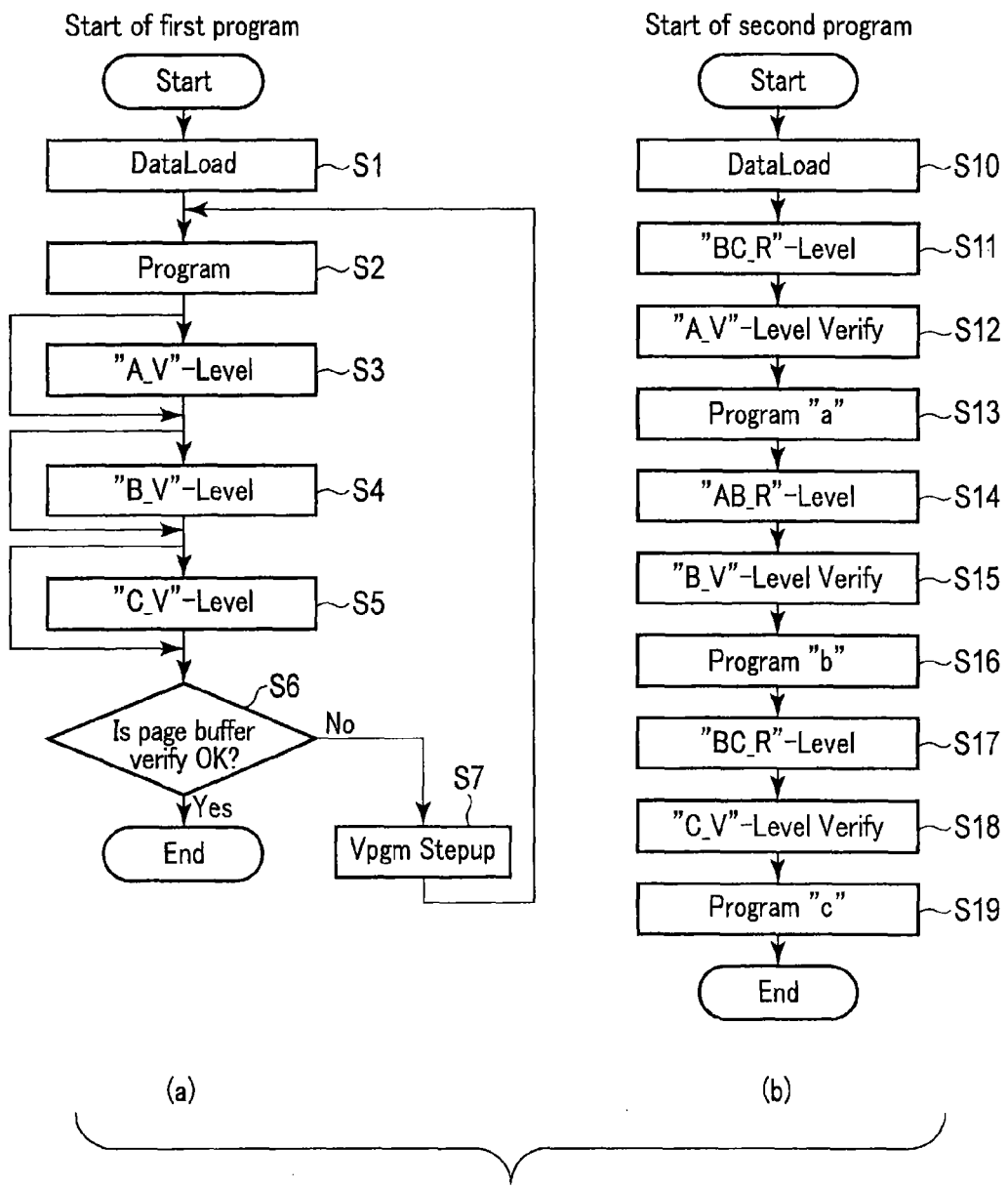
FIG. 26 is a flowchart showing a program sequence according to a third embodiment.

(a) and (b) in FIG. 26 are flowcharts showing program sequences according to the third embodiment. A first program sequence represented by (a) in FIG. 26 is the same as the first write operations in the first embodiment and the modification of the first embodiment or the second embodiment. A second program sequence represented by (b) in FIG. 26 is the same as the second write operation in the first embodiment. It is to be noted that, in this example, the second write operation in the modification of the first embodiment or the second embodiment may be executed in place of the second program sequence represented by (b) in FIG. 26.

Based on the first program sequence represented by (a) in FIG. 26, data of 2 bits, i.e., data "a", "b", and "c" are written in memory cells, and the first program sequence is terminated. Then, after a fixed period of time, data of 2 bits are again written in the same memory cells based on the second program sequence represented by (b) in FIG. 26.

In the second program sequence, the second write operation is executed by using data of 1 bit generated from the write data of 2 bits. Although the write data in the second program sequence may be held in the data storage circuits shown in FIG. 2 or 3, a latch circuit may be newly provided to hold the data. If the latch circuit is newly provided and a chip size disadvantageously increases, the write data in the second program sequence may be stored in some of the memory cells as 2-value data. Furthermore, the data may be again transferred to the memories from an external controller. In any case, data corresponding to 2 bits is not required, and only data of 1 bit generated from 2 bits can suffice, thereby suppressing a data transfer time and a memory region.

The second program sequence may be executed after writing data in a memory cell adjacent to a writing target memory cell. An example of such a case will now be described hereinafter with reference to FIG. 27.

FIG. 27 is a circuit diagram showing a configuration of a memory cell array of an NAND flash memory having a three-dimensional structure called an i type. NAND strings 19 are arranged in the memory cell array. One NAND string 19 includes, e.g., memory cells MC formed of, e.g., 64 series-connected EEPROMs, dummy cell transistors DTD and DTS, and selection transistors SGS and SGD. The selection transistors SGS0 to SGS3 are connected to ends of the series-connected memory cells MC, respectively. The selection transistors SGD0 to SGD3 are connected to the other ends of the memory cells MC, respectively.

Ends of the NAND strings 19 are connected to a source line SRC. The other ends of the NAND strings 19 are connected to a bit line BL. Moreover, control gates of the memory cells MC arranged in each row direction are connected to word lines WLDS, WL1 to WL63, and WLDD in common, respectively.

It is to be noted that gates of the selection transistors SGS0 to SGS3 may be connected to a common wiring SGS and the memory cell strings may be selected by the selection transistors SGD0 to SGD3, respectively. Additionally, both the selection transistors SGS and SGD may be formed of memory cell transistors having the same MONOS structure as those of the memory cells, respectively.

In the memory cell array having such a configuration, based on the first program sequence, writing is executed in the memory cells in the order of (1), (2), (3), and (4) as shown in FIG. 27. Then, based on the second program sequence, writing is again executed in the memory cells in the order of (1), (2), (3), and (4).

Further, in accordance with the first program sequence, writing is executed in the memory cells in the order of (5), (6), (7), and (8). Subsequently, in accordance with the second program sequence, writing is again executed in the memory cells in the order of (5), (6), (7), and (8).

Furthermore, as a different writing order, in accordance with the first program sequence, writing is again executed in the memory cells in the order of (1), (2), (3), and (4) as shown in FIG. 27. Then, in accordance with the first program sequence, wiring is executed in the memory cells in the order of (5), (6), (7), and (8). Thereafter, in accordance with the second program sequence, writing is again executed in the memory cells in the order of (1), (2), (3), and (4). Then, in accordance with the first program sequence, writing is executed in the memory cells in the order of (9), (10), (11), and (12). Subsequently, in accordance with the second program sequence, writing is again executed in the memory cells in the order of (5), (6), (7), and (8).

Moreover, to alleviate read disturbance, when the selection transistors SGS must be divided like the selection transistors SGD0 to SGD3 but processing is difficult, the selection transistors SGS are formed of depression type (D-type) (indicated by (D)) and enhancement type (E-type) (indicated by (E)) transistors.

For example, in case of selecting the NAND string NS0, an L-level voltage that turns on the D-type of the selection transistor SGS0 and turns off the E-type of the same is applied, and an H-level voltage that turns on both the D-type and the E-type is applied to the selection transistors SGS1 to SGS3, thereby selecting the NAND string NS0 alone.

In case of selecting the NAND string NS1, the L-level voltage that turns on the D-type of the selection transistor SGS1 and turns off the E-type of the same is applied, and the H-level voltage that turns on both the D-type and the E-type is applied to the selection transistors SGS0, SGS2, and SGS3, thereby selecting the NAND string NS1 alone.

Likewise, in case of selecting the NAND string NS2 alone, the L-level voltage can be applied to the selection transistor SGS2, and the H-level voltage can be applied to the selection transistors SGS0, SGS1, and SGS3, thereby selecting the NAND string NS2 alone. In case of selecting the NAND string NS3, the L-level voltage can be applied to the selection transistor SGS3, and the H-level voltage can be applied to the selection transistors SGS0 to SGS2, thereby selecting the NAND string NS3 alone.

A modification of the third embodiment will now be described.

Figure 29:
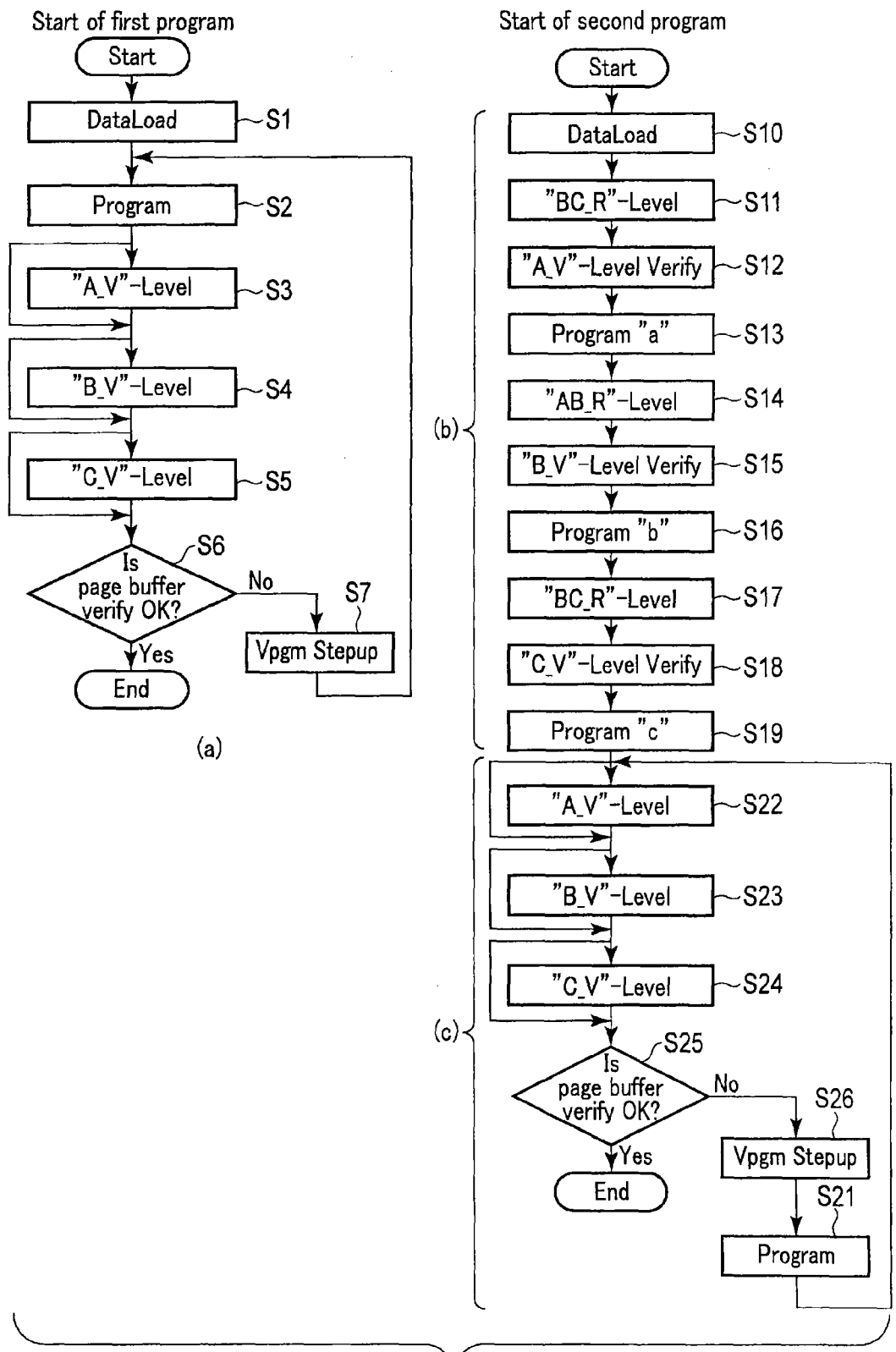
FIG. 29 is a flowchart showing a program sequence according to a modification of the third embodiment.

FIG. 29 is a flowchart showing program sequences according to the modification of the third embodiment. A first program sequence represented by (a) in FIG. 29 is the same as the first program sequence of the third embodiment represented by (a) in FIG. 26. Of a second program sequence represented by (b) and (c) in FIG. 29, a program sequence represented by (b) in FIG. 29 is the same as the second program sequence represented by (b) in FIG. 26, and a program sequence represented by (c) in FIG. 29 is a sequence added in this modification.

It is to be noted that, in this example, the second write operation in the modification of the first embodiment or the second embodiment may be carried out in place of the second program sequence represented by (b) in FIG. 29.

After performing writing to provide data "c" represented by (b) in FIG. 29 (a step S19), reading is carried out with respect to memory cells having data "a", "b", and "c" with the use of read voltage levels A_R, B_R, and C_R, respectively (steps S22, S23, and S24).

Subsequently, whether memory cells corresponding to data stored in the program buffer exceed a verify voltage level is determined. That is, whether the number of data latch circuits LDL set to "1" is a specified number or more is determined (a step S25). If the number of the data latch circuits LDL set to "1" is the specified number or more, the second program sequence is terminated.

On the other hand, if the number of the data latch circuits LDL set to "1" is less than the specified number, a write voltage Vpgm is slightly increased (step-up), the processing returns to a step S21, and writing of the step S21 and subsequent processing are executed.

Consequently, the write operation and a write verify operation are alternately repeated until the program operation is normally terminated.

In the modification, after end of the second program sequence in the third embodiment, reading is again executed with the use of the read voltage levels A_R, B_R, and C_R, and the write operation and the write verify operation are again repeated if a threshold value of each memory cell has not reached a verify voltage level.

According to the third embodiment and its modification, for example, when the first program sequence is executed with respect to memory cells in a page or a block and then the second program sequence is executed with respect to the memory cells in the same page or block, a data controller that supplies data to each data latch circuit does not have to store data of 2 bits in advance, and storing data of 1 bit can suffice, thus reducing a burden on a control section including the data controller.

As described above, according to this embodiment, during the first write operation, the data latch circuit that is not used for writing after end of writing to provide a lower threshold value is used as a cache for subsequent writing. Furthermore, in the additional second write operation, before writing, write data is restored by using data read between threshold levels of respective data and data of 1 bit generated from the write data of 2 bits, and the second write operation is executed based on this restored data. Consequently, before end of the second write operation, the data latch circuit can be used as a cache for subsequent writing.

Fourth Embodiment

FIG. 30 shows a write operation and a write verify operation in a program sequence of a semiconductor memory device according to a fourth embodiment.

In the first to third embodiment, the second program sequence operation is performed after the first program sequence. In the program sequence where one write operation and the write verify operation are repeated, the write verify is temporarily passed on, and a subsequent write voltage is supplied to a corresponding memory cell due to program Inhibit. If the memory cell turns to Fail in subsequent write verify and a subsequent write voltage is supplied, rewriting can be performed with respect to the memory cell as writing.

However, since a voltage value of a write voltage Vpgm is increased step by step in the repetition of the write operation and the write verify operation, the write voltage Vpgm for writing is likely to be a high voltage at this moment, over-program may possibly occurs. Thus, at the time of the rewriting, an intermediate voltage can be applied to a bit line, and a potential between a gate of a memory cell and a channel can be alleviated to enable writing. When the second write verify is passed on in this manner, subsequent writing can be non-writing. Configuring such a setting enables solving a problem of detrapping by again performing writing even if the write verify is temporarily passed on and then a threshold value Vth of a memory cell is lowered due to detrapping.

[Others]

The weak erase operation shown in FIGS. 16, 22, and 24 will now be described. The weak erase operation is executed after the first write operation and before the second write operation.

An operation waveform of the weak erase operation will be described with reference to FIG. 31.

Wf1 represents a waveform of a selected word line. The row decoder transfers a voltage VSGD (which is the same as VSGD applied to the write operation in this example, but VSGD_RV optimized for the weak erase operation may be used) to the gate of the selection transistor ST1 during a period from a time ta to a time tg. Additionally, the row decoder also transfers a voltage VSS to the gate of the selection transistor ST2. Here, since a threshold voltage of each selection transistor is approximately 1 to 2 V, if VSGD=2.5 V is set, the selection transistor ST1 enters a conductive state depending on a voltage level in its source terminal (a terminal on a side connected to a memory cell), and the selection transistor ST2 is turned off.

Further, the bit line control circuit 2 applies a voltage VDDSA (e.g., 2.5 V) to a bit line during a period from the time ta to a time tf. In a case where the bit line is being charged with the voltage VDDSA from the time ta, when the source terminal of the selection transistor ST1 has a voltage raised to "VSGD-Vt_SGD" (Vt_SGD is a threshold voltage of the selection transistor ST1), the selection transistor ST1 enters a cutoff state.

Then, the word line control circuit 6 raises voltages of a selected word line and a non-selected word line to VREAD_RV during a period from a time tb to a time td. At this time, since the selection transistor ST1 is in the cutoff state, the channel is floating. Thus, the channel of the memory cell is boosted by coupling with the voltage VREAD_RV of the word lines WL, and increased to a potential Vch1 (≈VREAD_RV).

Furthermore, after the time td, the word line control circuit 6 keeps applying the voltage VREAD_RV to the non-selected word line WL, and lowers a potential of the selected word line WL from the voltage VREADRV to a voltage VRV (e.g., VSS=0V). Consequently, a potential in a control gate of a selected memory cell becomes, e.g., 0 V, and a channel region of the selected memory cell has a potential Vch1 raised by a non-selected memory cell, and a large potential difference arises between them. As a result, reverse stress can be applied to the selected memory cell.

Operation waveforms of another weak erase operation will now be described with reference to FIG. 32.

A weak erase operation shown in FIG. 32 is an example that the word line control circuit 6 applies a voltage (a negative voltage) lower than the voltage VSS or a voltage lower than a source line voltage as the voltage VRV to a selected word line in the weak erase operation shown in FIG. 31. Other basic operation waveforms are the same as those of the weak erase operation shown in FIG. 31.

In the example shown in FIG. 32, since the voltage VRV of a selected word line is set to a negative voltage at the time of applying reverse stress, the reverse stress can be applied by using a channel potential Vch lower than the channel potential Vch1 that must be applied when the voltage VRV is the voltage VSS. Thus, the voltage VREAD_RV applied to a non-selected word line can be set to be lower than that in case of setting the voltage VRV to the voltage VSS. Further, the voltage VREAD_RV can be adjusted to the voltage VREAD at the time of the write verify.

As described above, according to the embodiment, it is possible to provide the semiconductor memory device that can suppress an influence of a fluctuation in threshold value immediately after writing in the memory cells and can realize high-speed writing.

Furthermore, although the example where this embodiment is applied to the memory cells each of which can store data of 2 bits has been described, the embodiment can be likewise applied to memory cells each of which can store data of n bits (n is a natural number of 2 or more).

Moreover, this embodiment is not restricted to the NAND flash memory, and it can be applied to other general memory devices. Additionally, although the respective embodiments may be solely carried out, but combinable embodiments may be combined and carried out.

It is to be noted that each embodiment according to the present invention has the following characteristics.

(1) In the read operation, a voltage applied to a word line selected for a read operation of a level (data "a") falls within the range of, e.g., 0 V to 0.55 V, or may be set to any one of the ranges 0.1 V to 0.24 V, 0.21 V to 0.31 V, 0.31 V to 0.4 V, 0.4 V to 0.5 V, and 0.5 V to 0.55 V without being restricted to the former range;

a voltage applied to a word line selected for a read operation of a B level (data "b") falls within the range of, e.g., 1.5 V to 2.3 V, or may be set to any one of the ranges 1.65 V to 1.8 V, 1.8 V to 1.95 V, 1.95 V to 2.1 V, and 2.1 V to 2.3 V without being restricted to the former range; and a voltage applied to a word line selected for a read operation of a C level (data "c") falls within the range of, e.g., 3.0 V to 4.0 V, or may be set to any one of the ranges 3.0 V to 3.2 V, 3.2 V to 3.4 V, 3.4 V to 3.5 V, 3.5 V to 3.6V, and 3.6 V to 4.0 V without being restricted to the former range.

A read operation time (tR) may be set to fall within the range of, e.g., 25 µs to 38 µs, 38 µs to 70 or 70 µs 80 µs.

(2) The write operation includes the program operation and the verify operation. In the write operation, a voltage first applied to a word line selected in the program operation falls within the range of, e.g., 13.7 V to 14.3 V, or may be set to fall within one of the ranges of, e.g., 13.7 V to 14.0 V and 14.0 V to 14.6 V without being restricted to the former range, a voltage first applied to a selected word line at the time of writing data in odd-numbered word lines and a voltage first applied to a selected word line at the time of writing data in even-numbered word lines may be changed.

When the program operation is based on an incremental step pulse program (ISPP) system, a step-up voltage is, e.g., approximately 0.5 V.

A voltage applied to a non-selected word line may be set to fall within the range of, e.g., 6.0 V to 7.3 V. This voltage may be also set to the range of, e.g., 7.3 V to 8.4 V or may be set to 6.0 V or less without being restricted to the former case.

A path voltage to be applied may be changed depending on whether a non-selected word line is an odd-numbered word line or an even-numbered word line.

A write operation time (tProg) may be set fall within the range of, e.g., 1700 µs to 1800 µs, 1800 µs to 1900 µs, or 1900 µs to 2000 µs.

(3) In the erase operation, a voltage first applied to a well that is formed in a semiconductor substrate upper portion and has the memory cells arranged thereabove falls within the range of, e.g., 12 V to 13.6 V. This voltage may be set to the range of, e.g., 1.6 V to 14.8 V, 14.8 V to 19.0 V, 19.0 V to 19.8 V, or 19.8 V to 21 V without being restricted to the former case.

An erase operation time (tErase) may be set to a period of, e.g., 3000 µs to 4000 µs, 4000 µs to 5000 µs, or 4000 µs to 9000 µs.

(4) A configuration of each memory cell has a charge storage layer arranged on the semiconductor substrate (a silicon substrate) through a tunnel insulating film having a film thickness of 4 to 10 nm. This charge storage layer may be formed into a lamination structure of an insulating film of, e.g., SiN or SiON having a film thickness of 2 to 3 nm and polysilicon. Further, a metal such as Ru may be added to the polysilicon. The charge storage layer has an insulating film thereon. This insulating film has a silicon oxide film having a film thickness of 4 to 10 nm that is sandwiched between a lower High-k film having a film thickness of 3 to 10 nm and an upper High-k film having a film thickness of 3 to 10 nm. The High-k film is made of, e.g., HfO. Furthermore, the film thickness of the silicon oxide film may be set to be larger than the film thickness of the High-k film. A control electrode having a film thickness of 30 nm to 70 nm is formed on the insulating film through a work function adjusting material having a film thickness of 3 to 10 nm. Here, the work function adjusting material is, e.g., a metal oxide film of TaO or the like or a metal nitride film of TaN or the like. W and the like can be used for the control electrode.

Moreover, an air gap may be formed between the memory cells.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a memory cell array comprising memory cells each of which is configured to store data of n bits (n is a natural number equal to 2 or more);
    a data storage circuit which holds first data to be written into one of the memory cells and also holds 1 bit data calculated from the first data; and
    a control circuit which writes the data of n bits into the memory cell in a first write operation and then executes a second write operation,
    wherein, in the second write operation, the control circuit reads data stored in the memory cell in the first write operation,
    restores the first data based on the data read from the memory cell and the data of 1 bit held in the data storage circuit, and
    writes the restored first data into the memory cell.

2. The semiconductor memory device according to claim 1, wherein, when read voltage levels used for write verify of the memory cell in the first write operation are A, B, and C (A<B<C), read voltage levels used for reading of data stored in the memory cell in the second write operation is E (A<E<B).

3. The semiconductor memory device according to claim 1, wherein, when read voltage levels used for write verify of the memory cell in the first write operation are A, B, and C (A<B<C), read voltage levels used for reading data stored in the memory cell in the second write operation is F (B<F<C).

4. The semiconductor memory device according to claim 1, wherein the data storage circuit comprises latch circuits each of which temporarily stores bits, writing of at least data of 1 bit is completed during the first write operation, and second data to be written in a subsequent write operation is temporarily held in a latch circuit that is not used for the first write operation in the latch circuits.

5. The semiconductor memory device according to claim 1, wherein the data storage circuit comprises latch circuits each of which temporarily stores bits, and second data to be written in a subsequent write operation is temporarily held in a latch circuit that is not used for the second write operation in the latch circuits after end of the first write operation or during the second write operation.

6. The semiconductor memory device according to claim 1, wherein, after end of the second write operation, the second write operation is again repeatedly executed.

7. The semiconductor memory device according to claim 1, wherein the memory cells include a first memory cell and a second memory cell,
writing is executed by the first write operation in the order of the first memory cell and the second memory cell connected to a first word line, and
then writing is executed by the second write operation in the order of the first memory cell and the second memory cell.

8. The semiconductor memory device according to claim 1, wherein the memory cells include a first memory cell, a second memory cell, a third memory cell and a fourth memory cell,
writing is executed by the first write operation in the order of the first memory cell and the second memory cell connected to a first word line and the third memory cell and the fourth memory cell connected to a second word line, and
then writing is executed by the second write operation in the order of the first memory cell, the second memory cell, the third memory cell and the fourth memory cell.

9. The semiconductor memory device according to claim 1, wherein the first write operation and second write operation are executed as one program sequence.

10. The semiconductor memory device according to claim 1, wherein the control circuit executes a weak erase operation between the first write operation and the second write operation, and
the control circuit applies a weak erase voltage to the memory cell in the weak erase operation, the weak erase voltage has a reverse voltage for a write voltage applied to the memory cell in the first and second write operations.

11. A semiconductor memory device comprising:
a memory cell array comprising memory cells each of which is configured to store data of n bits (n is a natural number equal to 2 or more);
a data storage circuit which holds first data to be written into one of the memory cells and also holds 1 bit data calculated from the first data; and
a control circuit which writes data of n bits into the memory cell in a first write operation and then executes a second write operation,
wherein, in the second write operation, the control circuit performs verify reading with respect to the memory cell subjected to writing in the first write operation to discriminate a memory cell that has not reached a verify voltage level,
restores the first data based on a result of the discrimination and the data of 1 bit held in the data storage circuit, and writes the restored first data into the memory cell that has not reached the verify voltage level.

12. The semiconductor memory device according to claim 11, wherein, when read voltage levels used for write verify of the memory cell in the first write operation are A, B, and C (A<B<C), read voltage levels used for reading of data stored in the memory cell in the second write operation is E (A<E<B).

13. The semiconductor memory device according to claim 11, wherein, when read voltage levels used for write verify of the memory cell in the first write operation are A, B, and C (A<B<C), read voltage levels used for reading data stored in the memory cell in the second write operation is F (B<F<C).

14. The semiconductor memory device according to claim 11, wherein the data storage circuit comprises latch circuits each of which temporarily stores bits, writing of at least data of 1 bit is completed during the first write operation, and second data to be written in a subsequent write operation is temporarily held in a latch circuit that is not used for the first write operation in the latch circuits.

15. The semiconductor memory device according to claim 11, wherein the data storage circuit comprises latch circuits each of which temporarily stores bits, and second data to be written in a subsequent write operation is temporarily held in a latch circuit that is not used for the second write operation in the latch circuits after end of the first write operation or during the second write operation.

16. The semiconductor memory device according to claim 11, wherein, after end of the second write operation, the second write operation is again repeatedly executed.

17. The semiconductor memory device according to claim 11, wherein the memory cells include a first memory cell and a second memory cell,
writing is executed by the first write operation in the order of the first memory cell and the second memory cell connected to a first word line, and
then writing is executed by the second write operation in the order of the first memory cell and the second memory cell.

18. The semiconductor memory device according to claim 11, wherein the memory cells include a first memory cell, a second memory cell, a third memory cell and a fourth memory cell,
writing is executed by the first write operation in the order of the first memory cell and the second memory cell connected to a first word line and the third memory cell and the fourth memory cell connected to a second word line, and
then writing is executed by the second write operation in the order of the first memory cell, the second memory cell, the third memory cell and the fourth memory cell.

19. The semiconductor memory device according to claim 11, wherein the first write operation and second write operation are executed as one program sequence.

20. The semiconductor memory device according to claim 11, wherein the control circuit executes a weak erase operation between the first write operation and the second write operation, and the control circuit applies a weak erase voltage to the memory cell in the weak erase operation, the weak erase voltage has a reverse voltage for a write voltage applied to the memory cell in the first and second write operations.

* * * * *